United States Patent [19]

Tanaka

[11] Patent Number: 5,468,580
[45] Date of Patent: Nov. 21, 1995

[54] CONDITION OPTIMIZATION METHOD FOR MEASURING OVERLAY ACCURACY OF PATTERN

[75] Inventor: Yasushi Tanaka, Kanagawa, Japan

[73] Assignee: Sony Corporation, Tokyo, Japan

[21] Appl. No.: 115,553

[22] Filed: Sep. 3, 1993

[30] Foreign Application Priority Data

Sep. 3, 1992 [JP] Japan .................................. 4-258824
Jan. 22, 1993 [JP] Japan .................................. 5-025989

[51] Int. Cl.$^6$ ...................................................... G03F 9/00
[52] U.S. Cl. .................................. 430/22; 430/5; 430/30; 355/53
[58] Field of Search .................................. 430/5, 30, 22; 355/53

[56] References Cited

U.S. PATENT DOCUMENTS 4,985,634  1/1991  Stengl et al. .............................. 430/30
5,283,141  2/1994  Yoon et al. ................................ 430/30

Primary Examiner—S. Rosasco
Attorney, Agent, or Firm—Hill Steadman & Simpson

[57] ABSTRACT

A method of optimizing measurement conditions of an overlay metrology system without etching process, and this method comprising the steps of forming a first overlay measurement pattern formed of first measurement marks and a second overlay measurement pattern formed of second measurement marks on a substrate, measuring an overlay deviation amount between the first measuring mark and the second measurement mark by the overlay metrology system, calculating an overlay deviation amount difference by subtracting a predetermined overlay deviation amount from respective overlay deviation amounts and adjusting measurement conditions of the overlay metrology system such that a fluctuation of the overlay deviation amount difference is minimized.

5 Claims, 21 Drawing Sheets

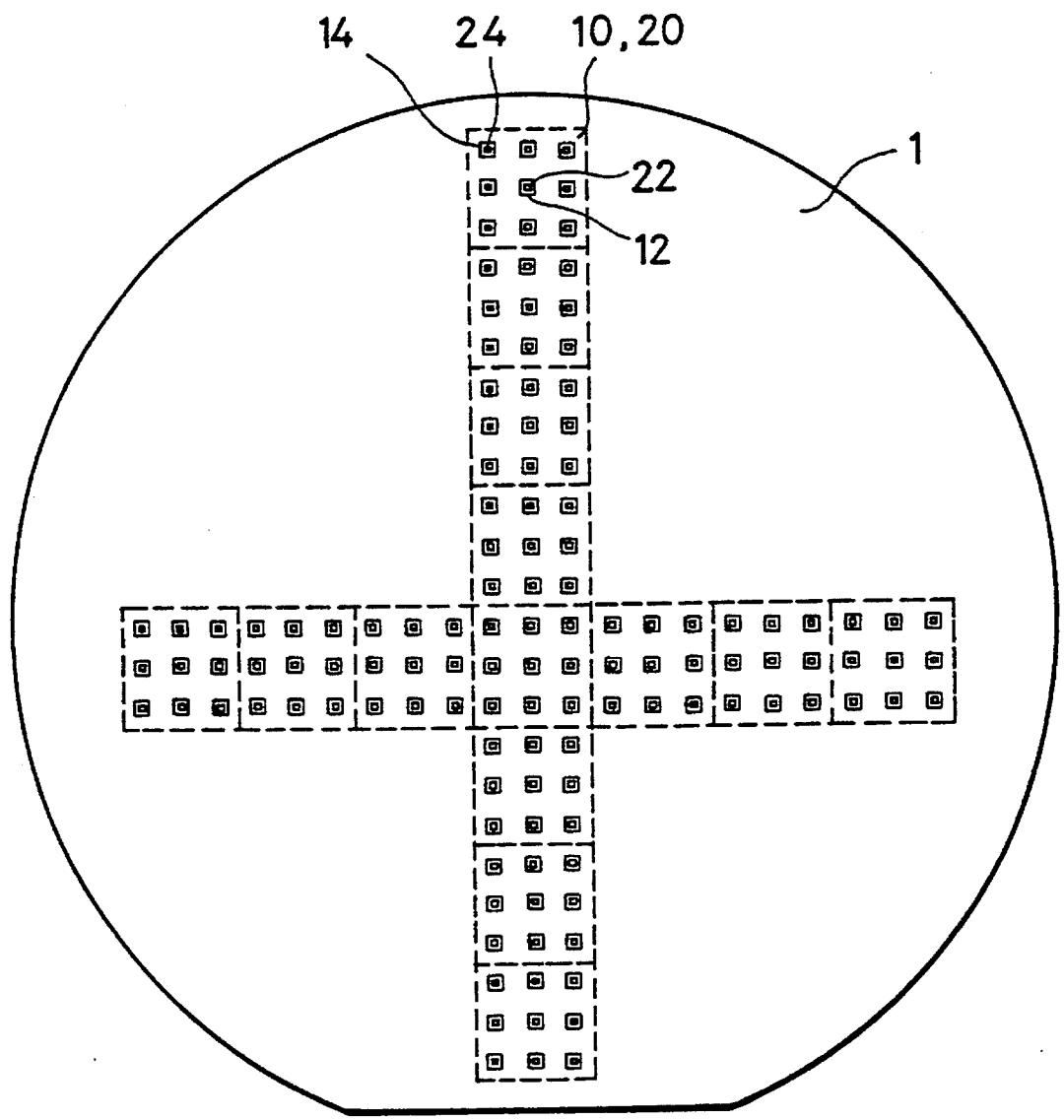

FIG.19A (Positive Type Alignment Mark)
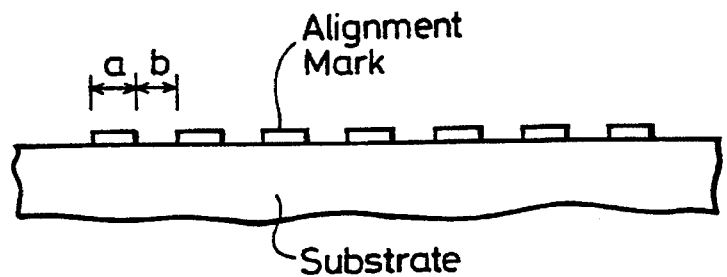
FIG.19B (Negative Type Alignment Mark)
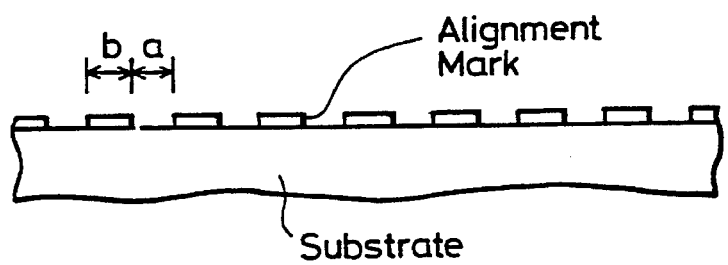
FIG.19C
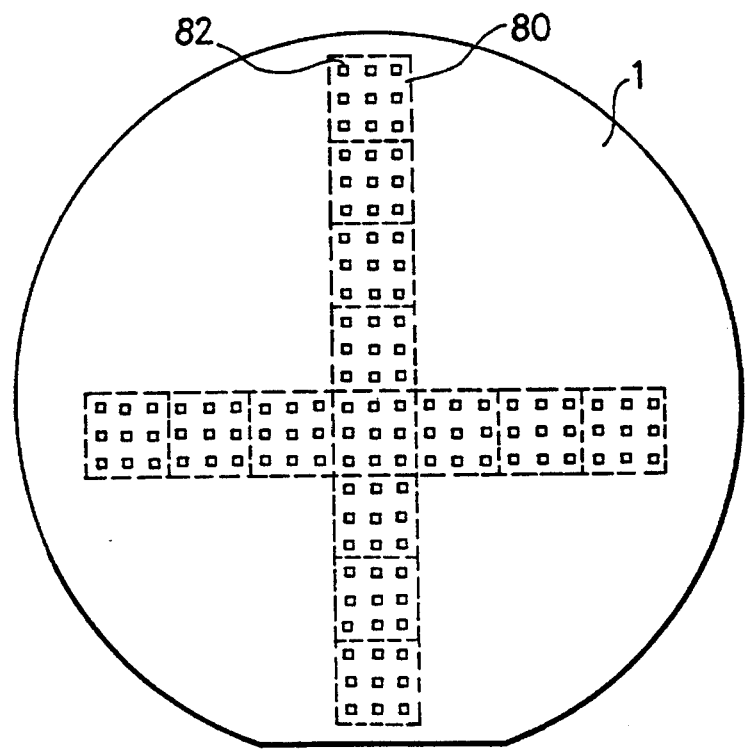

FIG. 21A
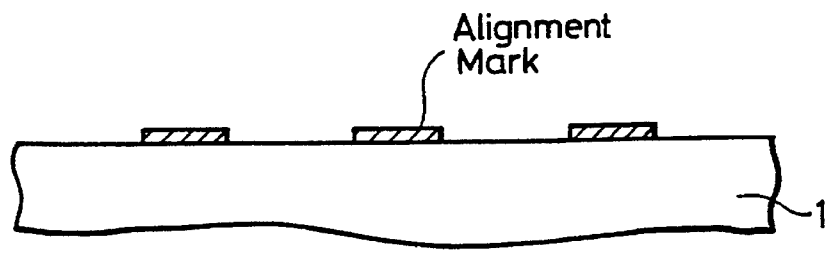
FIG. 21B   In The Case of "Single"
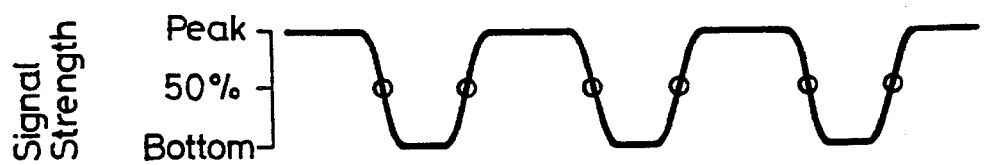
FIG. 21C   In The Case of "Double"
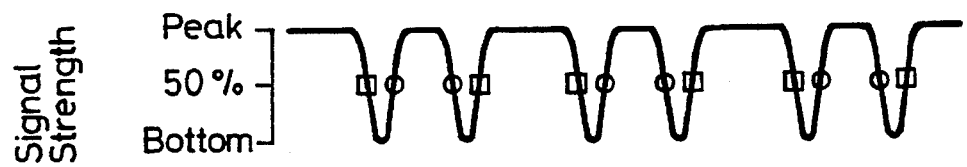
FIG. 22
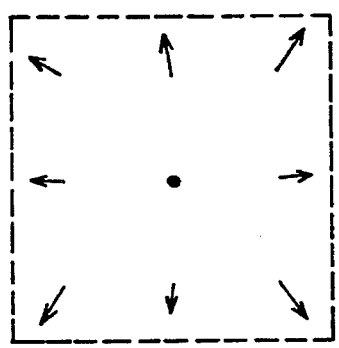

CONDITION OPTIMIZATION METHOD FOR MEASURING OVERLAY ACCURACY OF PATTERN

BACKGROUND OF THE INVENTION

1. Field of the Invention

The present invention relates to a method of optimizing measurement conditions of an overlay metrology system and a method of optimizing an alignment mark shape or an alignment mark measuring system in an aligner.

2. Description of the Related Art

Overlay metrology systems are used to determine whether or not elements of semiconductor devices and LCD (liquid crystal display) devices are properly overlaid each other or whether the pattern formed in accordance with the under layer is deviated from the under layer when semiconductor devices and LCD devices are manufactured, for example. As the overlay metrology system, scanning electron microscope (SEM) type overlay metrology systems and optical type overlay metrology systems are now commercially available on the market. FIG. 1 of the accompanying drawings shows an outline of the optical type overlay metrology system.

Standards of accuracy of conventional overlay metrology system are a measurement reproducibility ($3\sigma$) and TIS (Tool-Induced-Shift).

The measurement reproducibility ($3\sigma$) can be obtained by calculating fluctuations of measured values of overlay accuracy relative to the same measurement mark after overlay accuracy had been sequentially measured at a plurality of measuring marks formed on a substrate and the measurement had been repeated a plurality of times. Incidentally, $\sigma$ represents a fluctuation (standard deviation) of measured values of overlay accuracy relative to the same measurement mark. If $3\sigma$ is larger, measured values are fluctuated even though the same measurement mark is measured. That is to say, accuracy of the overlay metrology system is low.

TIS is defined as follows. Position coordinates of a plurality of measurement marks formed on the substrate are measured sequentially. Then, the substrate is rotated 180 degrees and position coordinates of a plurality of measurement marks formed again on the substrate are measured sequentially. Assuming that X coordinate and Y coordinate of a certain measurement mark provided before the substrate is rotated are $X_0$ and $Y_0$ and that X coordinate and Y coordinate of the above-mentioned measurement mark provided after the substrate was rotated 180 degrees are $X_{180}$ and $Y_{180}$, then in the same measurement mark, we have:

$$X_0 = -X_{180}$$

$$Y_0 = -Y_{180}$$

However, the aforesaid equalities are not established in actual practice but we have:

$$X_0 \neq -X_{180}$$

$$Y_0 \neq -Y_{180}$$

Mean value of $X_0$ and $X_{180}$ and mean value of $Y_0$ and $Y_{180}$ are referred to as TIS. The TIS is an index of insufficiency of optical system, i.e., insufficiency of mainly perpendicularity of an optical axis of an illumination light of the overlay metrology system. If the TIS is larger, even when the same measurement mark is measured, an error of a measured value of overlay accuracy becomes large. That is, accuracy of the overlay metrology system is low.

When elements of semiconductor devices and LCDs are manufactured, overlay deviation occurs among the elements due to the following causes:

(A) An aligner has an error in exposure position setting;

(B) When elements are formed by using a plurality of steppers through a plurality of processes, lenses of the steppers have a lens distortion difference;

(C) A semiconductor substrate is contracted by heat; and (D) A pattern is transferred under the condition that the semiconductor substrate is rotated (i.e., so-called chip rotation occurs).

Further, an apparent overlay deviation of elements is caused by the overlay metrology system. In the SEM type overlay metrology system and the optical type overlay metrology system, the apparent overlay deviation is caused by:

(a) focus position of the overlay metrology system. Furthermore, in the optical type overlay metrology system, the apparent overlay deviation occurs due to the following causes:

(b) An image reading system when a measurement mark is read into the overlay metrology system as an image (e.g., bright field image, dark field image, interference image, scattered image);

(c) Various optical system constants, such as a numerical aperture of lens, wavelength band of an illumination light or the like;

(d) A difference of intensity; and (e) A distortion of an optical axis of an illumination light. A measurement error occurs in the overlay metrology system due to the aforesaid factors.

If the measurement conditions of the overlay metrology system are optimized, then the value of overlay deviation obtained by the overlay metrology system becomes close to a value of true overlay deviation amount. The true overlay deviation amount will be described with reference to FIGS. 2A through 2D. FIGS. 2A through 2D are fragmentary cross-sectional views schematically showing a semiconductor device, by way of example.

As shown in FIG. 2A, an interlevel insulator 102 made of $SiO_2$ is formed on a semiconductor substrate 100 by a CVD (chemical vapor deposition) method, and a contact hole 102 is formed through the interlevel insulator 102 by a RIE (reactive ion etching) method. Then, in order to form a wiring layer made of an aluminum at the central portion of the contact hole 104, an aluminum thin film layer 106 is formed on the whole surface by a sputtering method, for example (see FIG. 2B).

Then, a resist layer 110 formed as a pattern by a photolithography method is formed on the aluminum thin film layer 106 (see FIG. 2C). At that time, the aluminum thin film layers 106 formed on the stepped portions of the interlevel insulator 102 become asymmetrical coverages. $A_1$ and $B_1$ assume distances from stepped portions 108A, 108B of the aluminum thin film layer 106 to the resist layer 100, respectively.

Subsequently, the aluminum thin film layer 106 is etched away by using the resist layer 110 formed as the pattern to thereby eliminate the resist layer 110. In this way, there is obtained a semiconductor device having a structure shown in FIG. 2D. $A_2$ and $B_2$ assume distances from stepped portions 102A, 102B of the interlevel insulator 102 to the aluminum thin film layer 106A (wiring layer) formed as the pattern. In this case, since the aluminum thin film layer 106 is made asymmetrical by the stepped portions 102A, 102B of the interlevel insulator 102, a value of $(A_1-B_1)/2$ and a value of $(A_2-B_2)/2$ are different. That is, we have:

$(A_1-B_1)/2 \neq (A_2-B_2)/2$

The value of $(A_1-B_1)/2$ and the value of $(A_2-B_2)/2$ are referred to as overlay deviation amounts. Also, the value of $(A_2-B_2)/2$ provided after the etching process is referred to as a true overlay deviation amount.

Since the aluminum thin film layer 106 is made asymmetrical by the stepped portions 102A and 102B of the interlevel insulator 102, we have:

$(A_1-B_1)/2 \neq (A_2-B_2)/2$

Other causes are that incident angles of ions are asymmetrical when the aluminum thin film layer 106 is etched away and that the side walls of the resist layer 110 thus formed as the pattern are asymmetrical to each other.

When the true overlay deviation amount between the semiconductor device elements (e.g., the interlevel layer 102 and the wiring layer 106A in the above-mentioned example) in the semiconductor device after the etching process is larger than a predetermined value, a semiconductor apparatus becomes defective. Therefore, before the etching process, it must be determined whether or not the overlay deviation amount between the semiconductor device elements is larger than the predetermined value.

In the manufacturing process of semiconductor devices and LCDs, there is utilized an aligner of a step and repeat system. FIG. 3 schematically shows an example of an arrangement of the aligner of step and repeat type. The position of an exposure stage is controlled with accuracy by a laser interferometer. In order to etch the substrate with high accuracy by the aligner, the position of the substrate (or substrate stage) in the aligner must be controlled with high accuracy. To this end, a plurality of alignment marks are formed on the substrate in advance and the alignment marks are measured according to an alignment mark measurement system installed in the aligner. Then, the position of the substrate (or substrate stage) is controlled on the basis of measured results.

The aligner of the step and repeat system generally includes a plurality of alignment mark measurement systems. A plurality of alignment mark measurement systems may be formed of a plurality of hardwares or may be formed of a plurality of analytical algorithms (analytical algorithms for processing an output signal from a hardware) installed in one hardware.

In order to select the optimum alignment mark measurement system, i.e., in order to optimize these alignment mark measurement systems of the aligner, it is customary that alignment marks are measured by using various kinds of alignment mark measurement systems and the positions of the substrates are matched. Then, a photosensitive resin formed on the substrate is exposed and developed by the aligner to form a pattern in actual practice. Thereafter, a deviation of the position of the pattern formed by exposing and developing the photosensitive resin relative to the pattern of the under layer must be visually measured by using a vernier or the like or measured by the overlay metrology system. Then, the alignment mark measurement system which can produce the smallest deviation is selected.

The measurement reproducibility (3σ) and TIS that are the accuracy standards of the overlay metrology system do not include all measurement errors caused when the overlay metrology system is applied to the actual semiconductor devices having coarse surfaces, stepped portions or the like.

There is not known a method of optimizing measurement conditions of the overlay metrology system in order to minimize a measurement error included by the overlay metrology system.

Also, there is not known a method of optimizing measurement conditions of the overlay metrology system in order to correlate the true overlay deviation amount among the semiconductor device elements in the semiconductor device after the etching process and the overlay deviation amount among the semiconductor device elements in the semiconductor device before the etching process.

Particularly, in the measurement of the overlay deviation amount among the semiconductor device elements in the semiconductor device before the etching process, a measurement error tends to occur because images of the semiconductor device elements obtained by the overlay metrology system are not clear generally. Accordingly, in the prior art, it is very difficult to reduce the measurement error inherent in the overlay metrology system as much as possible.

Furthermore, there is not known a method of optimizing measurement conditions of the overlay metrology system in consideration of the fact that the values of the overlay deviation amounts before and after the etching process caused by the asymmetry of the coverages of, for example, the aluminum thin film layer 106 are different as described above with reference to FIGS. 2A through 2D.

In the aligner of the step and repeat type, the optimum measurement system is selected from a plurality of alignment mark measurement systems. That is, the alignment mark measurement system must be optimized. When the alignment mark measurement system is formed of a plurality of hardwares, alignment evaluation substrates that are subjected to the overlay exposure process must be produced at every hardware. When the alignment mark measurement system is formed of a plurality of analytical algorithms installed on one hardware, the alignment evaluation substrates that are subjected to the overlay exposure must be produced further at every analytical algorithms. Then, the deviation of the pattern formed by exposing and developing the photosensitive resin on such alignment evaluation substrate relative to the pattern of the under layer is measured and the alignment mark measurement system having the smallest deviation is selected.

In order to determine the shape of the alignment mark best suited to a certain alignment mark measurement system, alignment marks having various shapes must be formed on the substrate.

Therefore, when the alignment mark measurement system is formed of a plurality of hardwares and is further formed of a plurality of analytical algorithms installed on one hardware, a number of alignment evaluation substrates must be produced on the basis of many conditions in order to select the optimum alignment mark measurement system or optimum shape of the alignment mark.

As earlier described, it is frequently observed that the values of the overlay deviations before and after the etching process are different due to the asymmetry of the aluminum thin film layer in the stepped portions of the interlevel insulator. From the device design standpoint, the value of the overlay deviation amount provided after the etching process indicates the true overlay deviation amount. Therefore, when the values of the overlay deviation amounts before and after the etching process are different, the alignment mark measurement system is comprised of a plurality of hardwares and when the alignment mark measurement system is comprised of a plurality of analytical algorithms, after a number of alignment evaluation substrates are produced, the deviation of the pattern formed on the alignment evaluation substrate relative to the alignment mark is measured. Then, the etching is carried out, whereafter the true overlay deviation amount of the alignment evaluation sample must be measured by the overlay metrology system.

Therefore, a number of alignment evaluation substrates must be produced in consideration of many conditions. Also, after the etching process, the overlay deviation amounts must be measured. There is then the problem that a number of substrates and a number of processes are required. In addition, the measurement of the overlay deviation after the etching process contains a measurement error caused when the alignment measurement system is not optimized and a measurement error inherent in the overlay metrology system. These two types of measurement errors cannot be discriminated substantially.

OBJECTS AND SUMMARY OF THE INVENTION

Therefore, it is an object of the present invention to provide a method of optimizing measurement conditions of an overlay metrology system in which an overlay measurement error contained in the overlay metrology system can be minimized without measuring a true overlay deviation amount (i.e., only by the measurement before the etching process).

It is another object of the present invention to provide a method of optimizing measurement conditions of an overlay metrology system in which a true overlay deviation amount among semiconductor device elements in a semiconductor device after the etching process and an overlay deviation amount measured among the semiconductor device elements in the semiconductor device before the etching process are correlated with each other.

It is a further object of the present invention to provide a method of optimizing an alignment mark shape or alignment mark measurement system in which substrates and processes required to optimize the alignment mark measurement system can be reduced without the etching process.

A first object of the present invention is achieved by a method in which an overlay deviation amount between a plurality of first overlay measurement patterns and second overlay measurement pattern formed on a substrate is measured by an overlay metrology system and measurement conditions of the overlay metrology system are optimized on the basis of measured results of the overlay deviation amount.

According to a first aspect of the present invention, there is provided a method in which overlay deviation amounts between a plurality of first overlay measurement patterns and second overlay measurement patterns formed on a substrate are measured by an overlay metrology system and measurement conditions of the overlay metrology system are optimized on the basis of measured results of the overlay deviation amount which comprises the steps of forming on a substrate a plurality of first overlay measurement patterns, each being formed of a first center measurement mark and a plurality of periphery measurement marks disposed at the periphery of the center measurement mark, forming on a substrate a plurality of second overlay measurement patterns, each being formed of a second center measurement mark and a plurality of second periphery measurement marks disposed at the periphery of the second center measurement mark, a relative position relationship between the first center measurement mark and the first periphery measurement mark being equal to a relative position relationship between the second center measurement mark and the second periphery measurement mark from a design standpoint such that the second center measurement mark is formed at substantially a central portion of the first center measurement mark and that a plurality of second periphery measurement marks are formed at substantially central portions of a plurality of first periphery measurement marks, measuring the center measurement mark overlay deviation amount between the first center measurement mark and the second center measurement mark by an overlay metrology system in each of the first overlay measurement pattern and a corresponding second overlay measurement pattern to measure a periphery measurement mark overlay deviation amount between the first periphery measurement mark and the corresponding second periphery measurement mark, and obtaining an overlay deviation difference by subtracting the center measurement mark overlay deviation amount from each of the periphery measurement marks in each of the first overlay measurement pattern and the corresponding second overlay measurement pattern, wherein measurement conditions of the overlay metrology system are adjusted such that fluctuations of the overlay deviation amount differences are minimized.

In accordance with the first aspect of the method of optimizing measurement conditions of an overlay metrology system, the process for forming a plurality of first overlay measurement patterns on the substrate comprises the steps of forming a resist layer on a layer made of $SiO_2$, SiN, polysilicon, WSi, W or aluminum formed on a semiconductor substrate by a CVD method, an oxidation method or sputtering method and forming a plurality of first overlay measurement patterns on the layer by a lithography method and an etching method, and the process for forming a plurality of second overlay measurement patterns on the substrate comprises the steps of forming a resist layer on a semiconductor substrate in which a plurality of first overlay measurement patterns are formed and forming a plurality of second overlay measurement patterns on the resist layer by a lithography method.

A second object of the present invention is achieved by a method in which overlay measurement pattern areas are formed on a substrate, an overlay deviation amount of measurement mark formed on the overlay measurement pattern areas is measured by the overlay metrology system and measurement conditions of the overlay metrology system are optimized on the basis of measured results of the overlay deviation amount.

According to a second aspect of the present invention, there is provided a method in which an overlay measurement pattern area is formed on a substrate, an overlay deviation amount of a measurement mark formed on the overlay measurement pattern area is measured by an overlay metrology system and measurement conditions of the overlay metrology system are optimized on the basis of measured results of the overlay deviation amount which comprises the steps of forming an overlay measurement pattern area having a plurality of first measurement marks on a substrate, forming a thin film layer on the overlay measurement pattern area, forming a second measurement mark made of a resist material and whose relative position relationship is equal to a relative position relationship between a plurality of first measurement marks on the thin film layer above each of the first measurement marks, measuring an overlay deviation amount between a shape of a thin film layer affected by a shape of the first measurement mark of the overlay measurement area and the second measurement mark corresponding to the first measurement mark by the overlay metrology system while changing various measurement conditions of the overlay metrology system to thereby obtain a first overlay deviation amount corresponding to various measurement conditions of the overlay metrology system, etching the thin film layer by using the second measurement mark as a mask to form a third measurement mark from the thin film layer, measuring a second overlay deviation amount between the third measurement mark and the first measurement mark corresponding to the third measurement mark by the overlay metrology system, and calculating an overlay deviation amount difference indicative of a difference between the first overlay deviation amount corresponding to various measurement conditions of the overlay metrology and the corresponding overlay deviation amount, wherein measurement conditions of the overlay metrology system are selected such that a fluctuation of the overlay deviation amount difference is minimized.

Alternatively, the second object is achieved by a method in which overlay measurement pattern areas are formed on a substrate, an overlay deviation amount of the measurement marks formed on the overlay measurement pattern areas is measured by an overlay metrology system and measuring conditions of the overlay metrology system are optimized on the basis of measured results of the overlay deviation amount.

According to a third aspect of the present invention, there is provided a method in which an overlay measurement pattern area is formed on a substrate, an overlay deviation amount of a measurement mark formed on the overlay measurement pattern area is measured by an overlay metrology system and measurement conditions of the overlay metrology system are optimized on the basis of measured results of the overlay deviation amount which comprises the steps of forming on a substrate a plurality of overlay measurement pattern areas having a plurality of first measurement marks and second measurement marks adjacent to each of the first measurement marks, forming a thin film layer on the overlay measurement pattern areas, selectively removing the thin film layers on the first measurement marks to leave the thin film layer on the second measurement mark, forming a third measurement mark whose relative position relationship is designed to be equal to each of the first measurement marks in accordance with each of the first measurement marks and a fourth measurement mark whose relative position relationship is designed to be equal to each of the second measurement marks on a thin film layer formed above each of the second measurement mark, measuring an overlay deviation amount between a shape of a thin film layer formed with an influence of a shape of the second measurement mark in the overlay measurement pattern area and the fourth measurement mark by the overlay metrology system while changing various measurement conditions of the overlay metrology system to thereby obtain a first overlay deviation amount corresponding to various measurement conditions of the overlay metrology system and measuring an overlay deviation amount between the first measurement pattern and the third measurement pattern of the overlay measurement pattern area by the overlay metrology system while measurement conditions of the overlay metrology system are made constant to thereby obtain a second overlay deviation amount corresponding to a certain measurement condition of the overlay metrology system, and calculating an overlay deviation amount difference indicative of a difference between the first overlay deviation amount corresponding to various measurement conditions of the overlay metrology system and the corresponding second overlay deviation amount, wherein measurement conditions of the overlay metrology system are selected such that a fluctuation of the overlay deviation amount difference is minimized.

A third object of the present invention is achieved by a method in which a plurality of dies having a plurality of alignment marks are formed on a substrate, position coordinates of the alignment marks formed on the dies are measured by an alignment mark measuring system of an aligner and an alignment mark shape or an alignment mark measurement system in the aligner is optimized.

In accordance with a fourth aspect of the present invention, there is provided a method in which a plurality of dies having a plurality of alignment marks are formed on a substrate and position coordinates of alignment marks formed on the dies are measured by an alignment mark measurement system of an aligner to thereby optimize the alignment mark shape or the alignment mark measurement system of the aligner which comprises the steps of coating a substrate surface with a photosensitive resin after a plurality of dies having a plurality of alignment marks had been formed on a substrate by making relative position relationships designed to each of alignment marks in each die equal, measuring positions of respective alignment marks by an alignment mark measurement system of the aligner to calculate a position coordinate $(X_m, Y_m)$, calculating relative position coordinates $(X_{m-r}, Y_{m-r})$ of other respective alignment marks relative to a position coordinate $(X_{m-0}, Y_{m-0})$ of a reference point, the reference point being one of a plurality of alignment marks in each die or the reference point being an average value of position coordinates of all alignment marks within the die from a position coordinate $(X_m, Y_m)$, and calculating relative position coordinates $(X_{d-r}, Y_{d-r})$ designed for each of other alignment marks relative to a reference point to calculate a relative position coordinate difference $(\Delta X, \Delta Y)$ indicative of a difference between the position coordinate $(X_{d-r}, Y_{d-r})$ and relative position coordinate $(X_{m-r}, Y_{m-r})$ of each alignment mark calculated in the preceding process, wherein an alignment mark or alignment mark measurement system is selected such that a fluctuation of position coordinate difference $(\Delta X, \Delta Y)$ among a plurality of dies becomes minimum.

In the first aspect of the method of optimizing measurement conditions of the overlay metrology system according to the present invention, the overlay deviation amount difference between each of the periphery measurement marks and the center measurement mark is calculated. Since the position of the measurement mark is designed such that respective relative position relations of the first overlay measurement pattern and the corresponding second overlay measurement pattern become equal to each other therein, it is considered that the overlay deviation amount difference is substantially constant.

Accordingly, in the first overlay measurement pattern and the corresponding second overlay measurement pattern, if the fluctuations of the overlay deviation amount differences between the periphery measurement marks and each of the center measurement marks are calculated by combinations of a plurality of center measurement marks and a plurality of periphery measurement marks, of the causes of overlay deviations, the causes other than the measurement errors inherent in the overlay metrology system can be canceled each other out. In this way, the fluctuation of the overlay deviation amount difference corresponds to the measurement error inherent in the overlay metrology system. Therefore, if the measurement conditions of the overlay metrology system are adjusted such that the fluctuation of the overlay deviation amount difference becomes minimum, then without measuring the true overlay deviation amount (i.e., only by the measurement before the etching process), the measurement conditions of the overlay metrology system can be optimized.

In the second aspect of the method of optimizing the measurement conditions of the overlay metrology system according to the present invention, the overlay deviation amounts before and after the etching process is measured. A difference between the first overlay deviation amount before the etching process and the second overlay deviation amount after the etching process is caused by the overlay measurement errors inherent in the overlay metrology system. Further, such difference also is caused by asymmetry of the shape of the thin film layer formed with the influence of the first measurement mark of the overlay measurement pattern area. However, factors other then the measurement errors inherent in the overlay metrology system does not make a contribution to the fluctuation of the difference between the overlay deviation amounts before and after the etching process when a plurality of points are measured. Furthermore, the overlay measurement error of the overlay metrology system relative to the second overlay deviation amount between the third measurement mark and the first measurement mark is small.

Accordingly, the overlay deviation amount difference indicative of the difference between the first overlay deviation amount and the corresponding second overlay deviation amount is mainly caused by the measurement errors inherent in the overlay metrology system when the first overlay deviation amount is measured. Therefore, the measurement condition of the overlay metrology in which the fluctuation of the overlay deviation amount difference indicative of the difference between the first overlay deviation amount corresponding to various measurement conditions of the overlay metrology system and the corresponding second overlay deviation amount is minimized becomes the optimum measurement condition.

In the third aspect of the method of optimizing the measurement conditions of the overlay metrology system according to the present invention, the overlay deviation amount difference is calculated from the adjacent measurement marks. In one of the adjacent measurement marks, the thin film layer is selectively removed (i.e., etched away). In the other measurement mark of the adjacent measurement marks, the thin film layer is left. In addition to the asymmetry of the coverage of the thin film layer, there can be enumerated an incident angle of ion in the etching process, asymmetry of tapered portion of the resist layer or the like that causes the overlay deviation amounts before and after the etching process to become different. However, between the areas close to each other on the substrate, the contribution of these factors to the difference between the overlay deviation amounts is small. That is to say, although a very small difference exists between the second overlay deviation amount obtained from the overlay measurement pattern area from which the thin film layer is selectively removed and the overlay measurement amount between the etched thin film layer obtained when the thin film layer is etched by using the fourth measurement mark as the etching resist in the overlay measurement pattern area from which the thin film layer is not removed, it can be considered that a satisfactory correlation exists between the two overlay deviation amounts.

Almost all of the overlay deviation amount difference indicative of the difference between the first overlay deviation amount and the corresponding second overlay deviation amount is mainly caused by the measurement errors inherent in the overlay metrology system of the first overlay deviation amount. Therefore, the measurement condition of the overlay metrology system in which the overlay deviation amount difference indicative of the difference between the first overlay deviation amount corresponding to various measurement conditions of the overlay metrology system and the corresponding second overlay deviation amount is minimized becomes the optimum measurement condition.

In the method of optimizing the alignment mark shape of alignment mark measuring system in the aligner according to the present invention, the relative position coordinate $(\Delta X, \Delta Y)$ indicative of the difference between the relative position coordinate $(X_{m-r}, Y_{m-r})$ to the reference point of each alignment mark obtained from the position coordinate $(X_m, Y_m)$ and the relative designed position coordinate $(X_{d-r}, Y_{d-r})$ of each alignment mark relative to the reference point is calculated. Then, the alignment mark or alignment mark measuring system in which the fluctuation of such position coordinate $(\Delta X, \Delta Y)$ is minimized among a plurality of dies is minimized is selected.

As the factor that $(X_{m-r}, Y_{m-r})$ and $(X_{d-r}, Y_{d-r})$ become different (i.e., $\Delta X$ and $\Delta Y$ do not become zero) within one die, there can be enumerated the distortion of the aligner and the measurement error of the alignment mark coordinate of the aligner. Further, as other factors, there can be enumerated the thermal contraction of the substrate and the chip rotation. Of these factors, the distortion of the aligner, the thermal contraction of the substrate and the chip rotation become substantially the same values among the different dies so long as the positions within the die are the same. Accordingly, by calculating the fluctuation of the position coordinate $(\Delta X, \Delta Y)$, it is possible to cancel influences respectively exerted upon the position coordinate $(\Delta X, \Delta Y)$ by the distortion of the aligner, the thermal contraction of the substrate and the chip rotation.

That is, the fluctuation of the position coordinate $(\Delta X, \Delta Y)$ is mainly caused by the measurement error of the alignment mark coordinate of the aligner. Therefore, by selecting the alignment mark or alignment mark measuring system in which the fluctuation of the position coordinate $(\Delta X, \Delta Y)$ is minimized, the alignment mark shape or alignment mark measuring system in the aligner can be optimized.

The above, and other objects, features, and advantages of the present invention will become apparent from the following detailed description of illustrative embodiments thereof to be read in conjunction with the accompanying drawings, in which like reference numerals are used to identify the same or similar parts in the several views.

BRIEF DESCRIPTION OF THE DRAWINGS

FIG. 6 is a plan view showing first and second overlay measurement patterns formed on the substrate according to the first embodiment of the present invention;

FIGS. 19A, 19B and 19C are schematic fragmentary cross-sectional views showing alignment marks formed in the substrates and a plan view showing a die according to a fourth embodiment of the present invention, respectively;

FIGS. 21A, 21B and 21C are a schematic cross-sectional view and diagrams used to explain an analytical algorithm used by an aligner, respectively; and FIG. 22 is a diagram showing a relative position coordinate difference in the fourth embodiment of the present invention in a vector representation fashion.

DETAILED DESCRIPTION OF THE PREFERRED EMBODIMENTS

The present invention will now be described with reference to the drawings.

A first embodiment of the present invention is related to a first mode of a method of optimizing measurement conditions of an overlay metrology system according to the present invention. According to the method of the first embodiment, overlay deviation amounts among a plurality of first and second overlay measurement patterns formed on a substrate are measured by the overlay metrology system, and the measurement condition of the overlay metrology system is optimized on the basis of measured results of the overlay deviation amounts.

[Process—100]

In the method according to the first embodiment of the present invention, a plurality of first overlay measurement patterns 10, each being formed of a first center measurement mark 12 and a plurality of first periphery measurement marks 14 disposed at the periphery of the first center measurement mark 12 are formed on a substrate 1.

Figure 1:
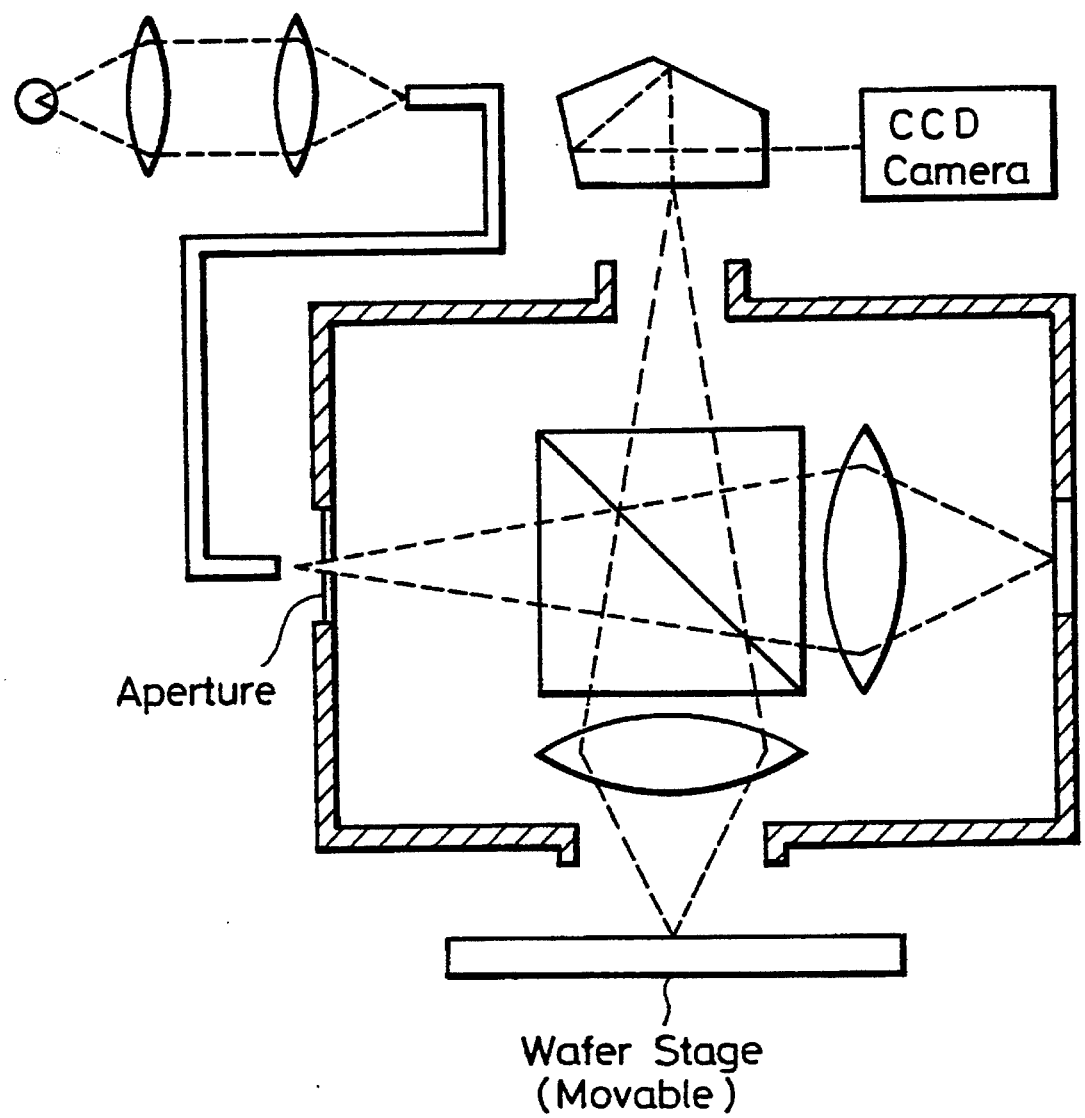
FIG. 1 is a schematic diagram showing an arrangement of an overlay metrology system of optical type.
Figure 2A:
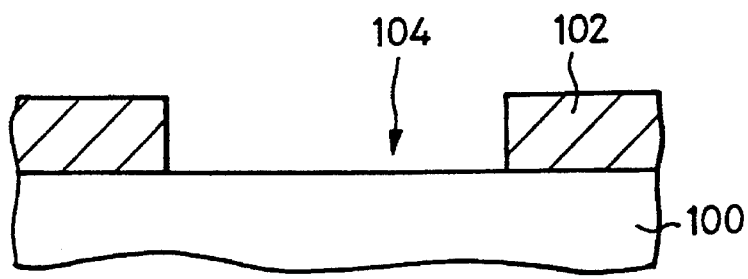
FIGS. 2A through 2D are schematic cross-sectional views used to explain a true overlay deviation amount, respectively.
Figure 2B:
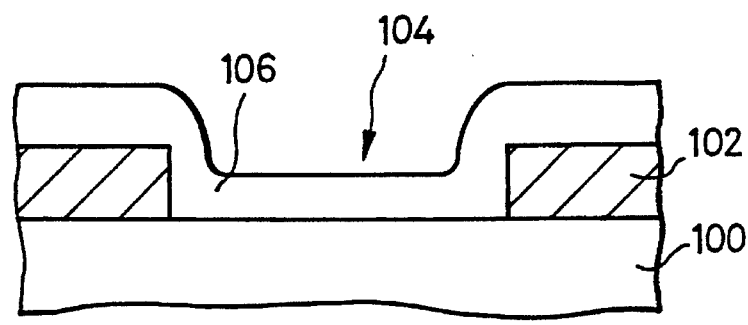
Figure 2C:
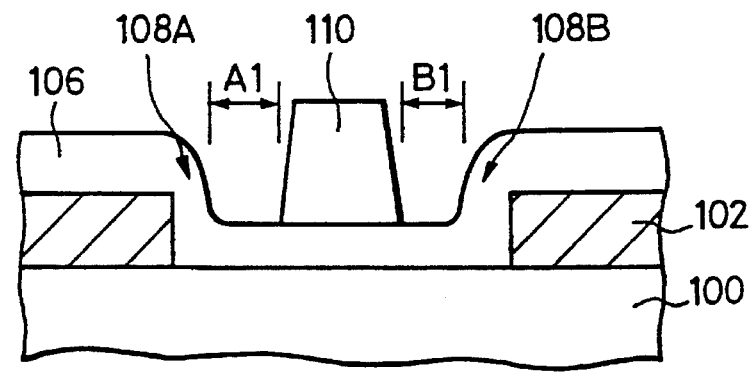
Figure 2D:
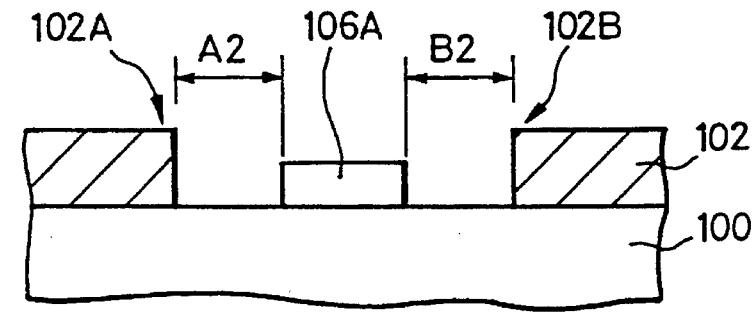
Figure 3:
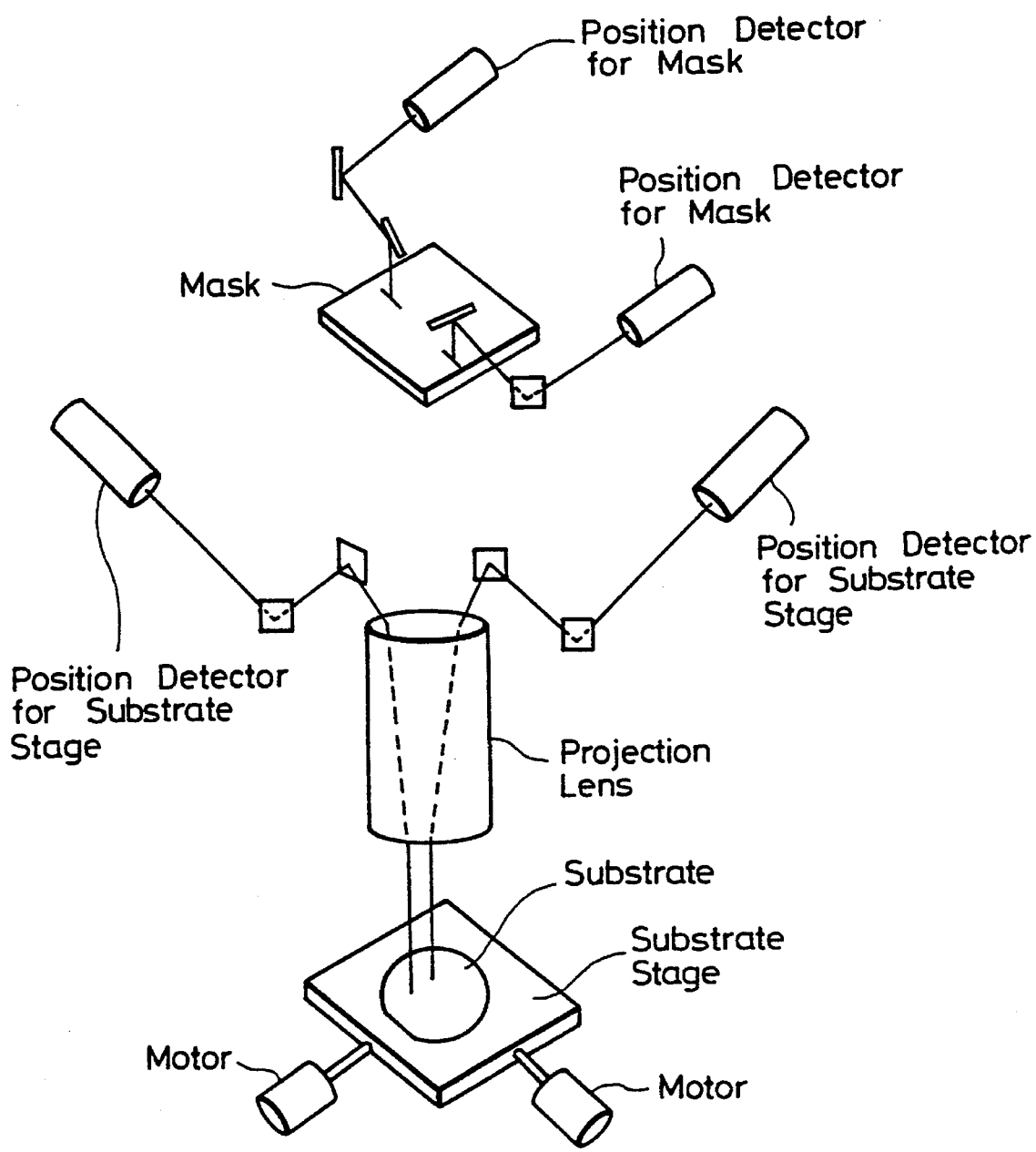
FIG. 3 is a schematic diagram showing an example of an arrangement of an aligner of a step and repeat type.
Figure 4:
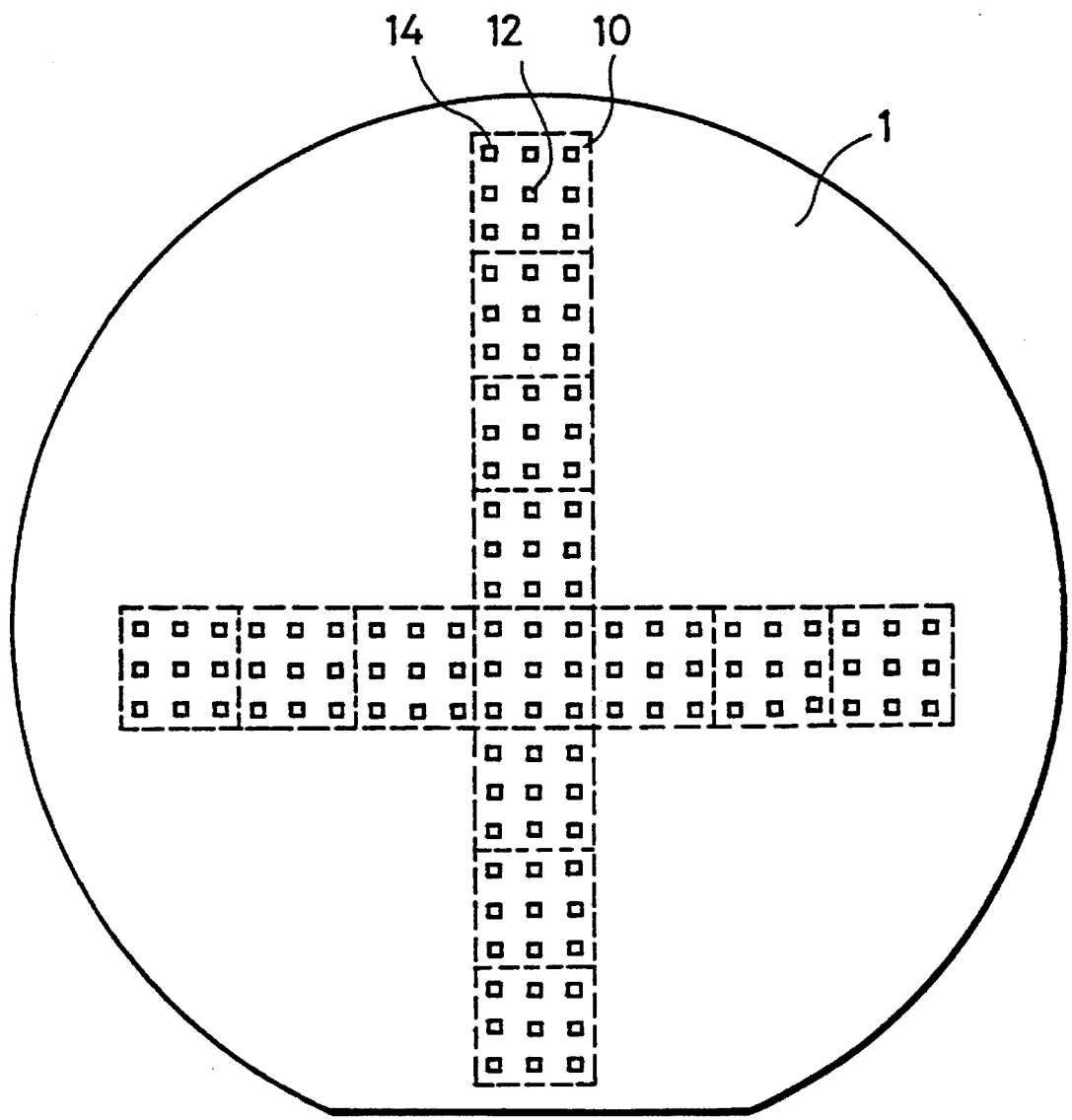
FIG. 4 is a plan view showing a first overlay measurement pattern formed on a substrate according to a first embodiment of the present invention.
Figure 5A:
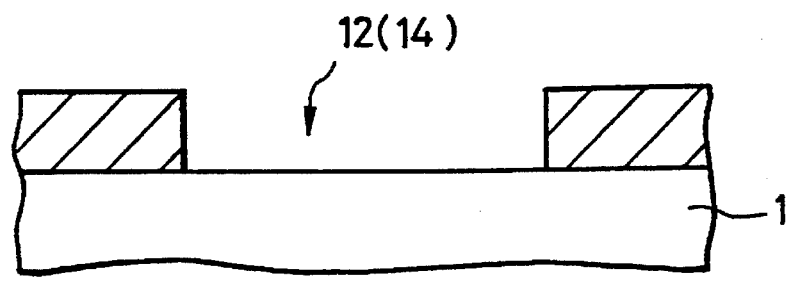
FIGS. 5A and 5B are a fragmentary cross-sectional view and a fragmentary plan view showing the first overlay measurement pattern formed on the substrate according to the first embodiment of the present invention in an enlarge scale, respectively.
Figure 5B:
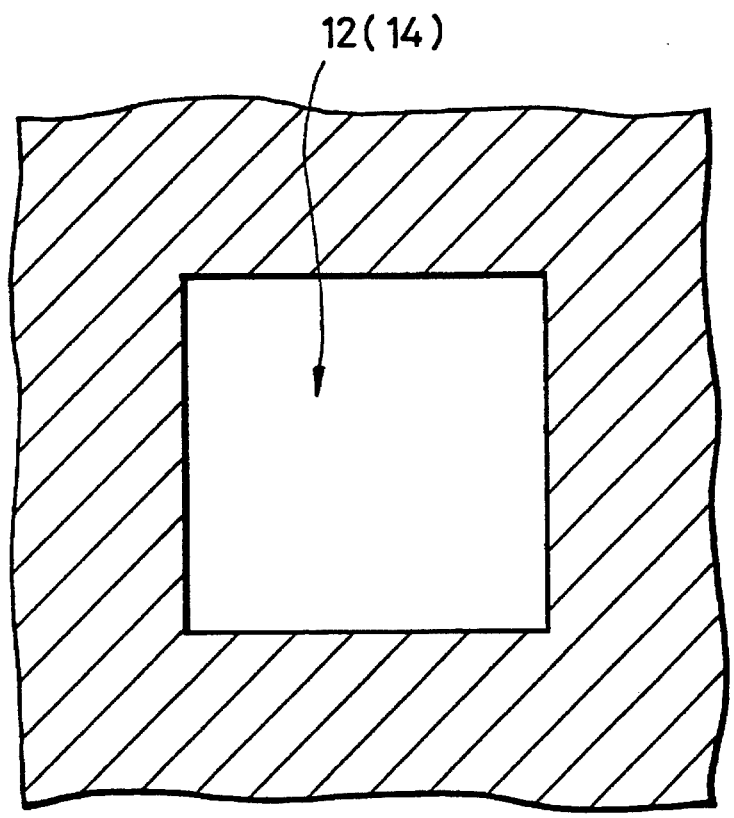

As shown in a schematic plan view of FIG. 4, a layer made of $SiO_2$, SiN, polysilicon, Wsi, W, aluminum or the like is formed on the substrate 1 by some suitable methods, such as a CVD (chemical vapor deposition) method, an oxidation method, a sputtering method or the like. Then, a plurality of (14 first overlay measurement patterns in the first embodiment) first overlay measurement patterns 10 are formed on the substrate 1 by a lithography method and an etching method. Each of the first overlay measurement patterns 10 is comprised of a first center measurement mark 12 and a plurality of (8 first periphery measurement marks in the first embodiment) first periphery measurement marks 12 disposed at the periphery of the first center measurement mark 12. Dashed lines in FIG. 4 represent areas occupied by the first overlay measurement pattern 10. The shape of the first center measurement mark 12 and that of the first periphery measurement mark 14 are selected to be the same. FIG. 5A is a fragmentary cross-sectional view and FIG. 5B is a fragmentary plan view showing the first center measurement mark 12 and the first periphery measurement mark 14 in an enlarged scale, respectively. Although the first center measurement mark 12 and the first periphery measurement mark 14 are shaped arbitrarily, they are formed as square opening portions, each side of which is 20 μm in the first embodiment. Outer shapes of the first center measurement mark 12 and the first periphery measurement mark 14 are arbitrary and are square, though not shown in the first embodiment. Further, a distance between the first periphery marks 14 is selected to be 2.5 mm.

[Process—110]

Subsequently, as shown in FIG. 6, a plurality of second overlay measurement patterns 20, each being formed of a second center measurement mark 22 and a plurality of second periphery measurement marks 24 disposed at the periphery of the second center measurement mark 22 are formed on the substrate 1 such that the second center measurement mark 22 is formed at substantially the central portion of the first center measurement mark 12 and that a plurality of second periphery measurement marks 24 are formed at substantially central portions of a plurality of first periphery measurement marks 14.

A relative position relationship between the first center measurement mark 12 and the first periphery measurement mark 14 and a relative position relationship between the second central measurement mark 22 and the second periphery measurement mark 24 are made equal to each other from a design standpoint or the like. In the first embodiment, one first overlay measurement pattern 10 is formed by using the stepper in one exposure.

Figure 7A:
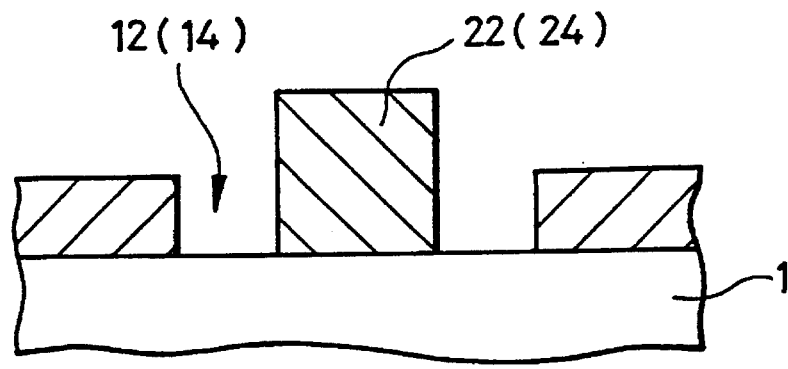
FIGS. 7A and 7B are a fragmentary cross-sectional view and a fragmentary plan view showing the first and second overlay measurement patterns formed on the substrate according to the first embodiment of the present invention in an enlarged scale, respectively.
Figure 7B:
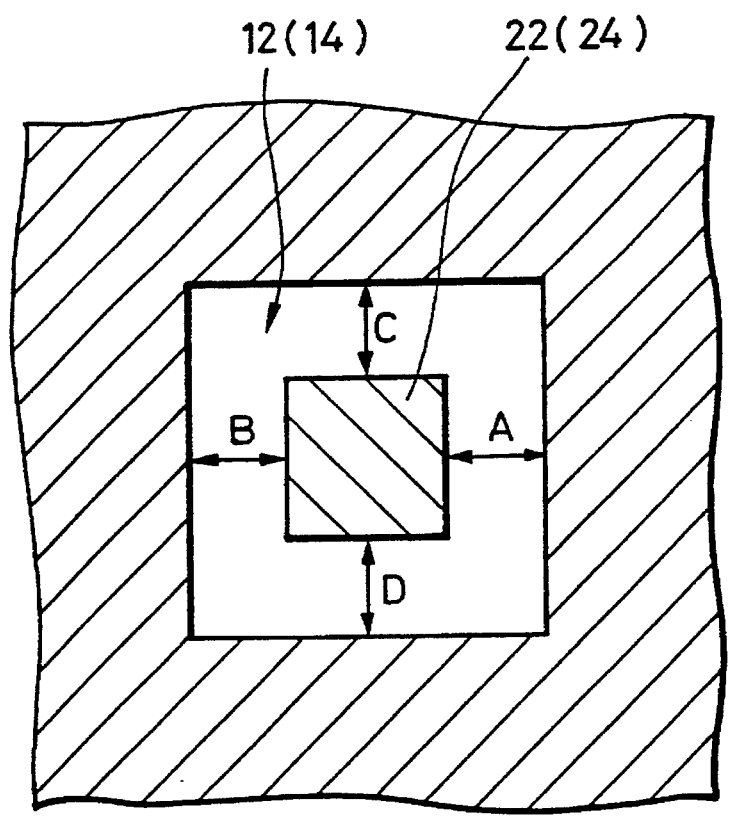

As shown in a schematic plan view of FIG. 6, a layer made of a resist material is formed on the whole surface, and a plurality of (14 second overlay measurement patterns in the first embodiment) second overlay measurement patterns 20 are formed on the substrate 1 by a lithography method. Each of the second overlay measurement patterns 20 is comprised of a second center measurement mark 22 and a plurality of (8 second periphery measurement marks in the first embodiment) second periphery measurement marks 22 disposed at the periphery of the second center measurement mark 20. The shape of the second center measurement mark 22 and that of the second periphery measurement mark 24 are selected to be the same. In the first embodiment, the second central measurement mark 22 is formed at substantially a center of the first center measurement mark 12, and the second periphery measurement mark 24 is formed at substantially the center of the first periphery measurement mark 14. FIG. 7A is a fragmentary cross-sectional view and FIG. 7B is a fragmentary plan view showing the first center measurement mark 12, the first periphery measurement mark 14, the second center measurement mark 22 and the second periphery measurement mark 24 in an enlarged scale, respectively. While the second central measurement mark 22 and the second periphery measurement mark 24 are shaped arbitrarily, they are shaped in square concave portion whose one side is 10 μm.

[Process—120]

In the first overlay measurement pattern 10 and the corresponding second overlay measurement pattern 20, a center measurement mark overlay deviation amount between the first and second center measurement marks 12 and 22 is measured, and a periphery measurement mark overlay deviation amount between the first periphery measurement mark 14 and the corresponding second periphery measurement mark 24 is measured.

The overlay deviation amounts of the X direction and the Y direction can be calculated on the basis of values A, B, C and D shown in FIG. 7B as:

$$\Delta X = (A-B)/2$$

$$\Delta Y = (C-D)/2$$

To be more concrete, the substrate 1 is held on the wafer stage of the overlay metrology system and the wafer stage is moved in the XY direction, thereby placing the measurement mark at the focus position of the objective lens. Then, a contrast difference of image is discriminated by a CCD camera and the values A, B, C and D are calculated on the basis of (X, Y) coordinate in which the contrast difference occurred.

Figure 8:
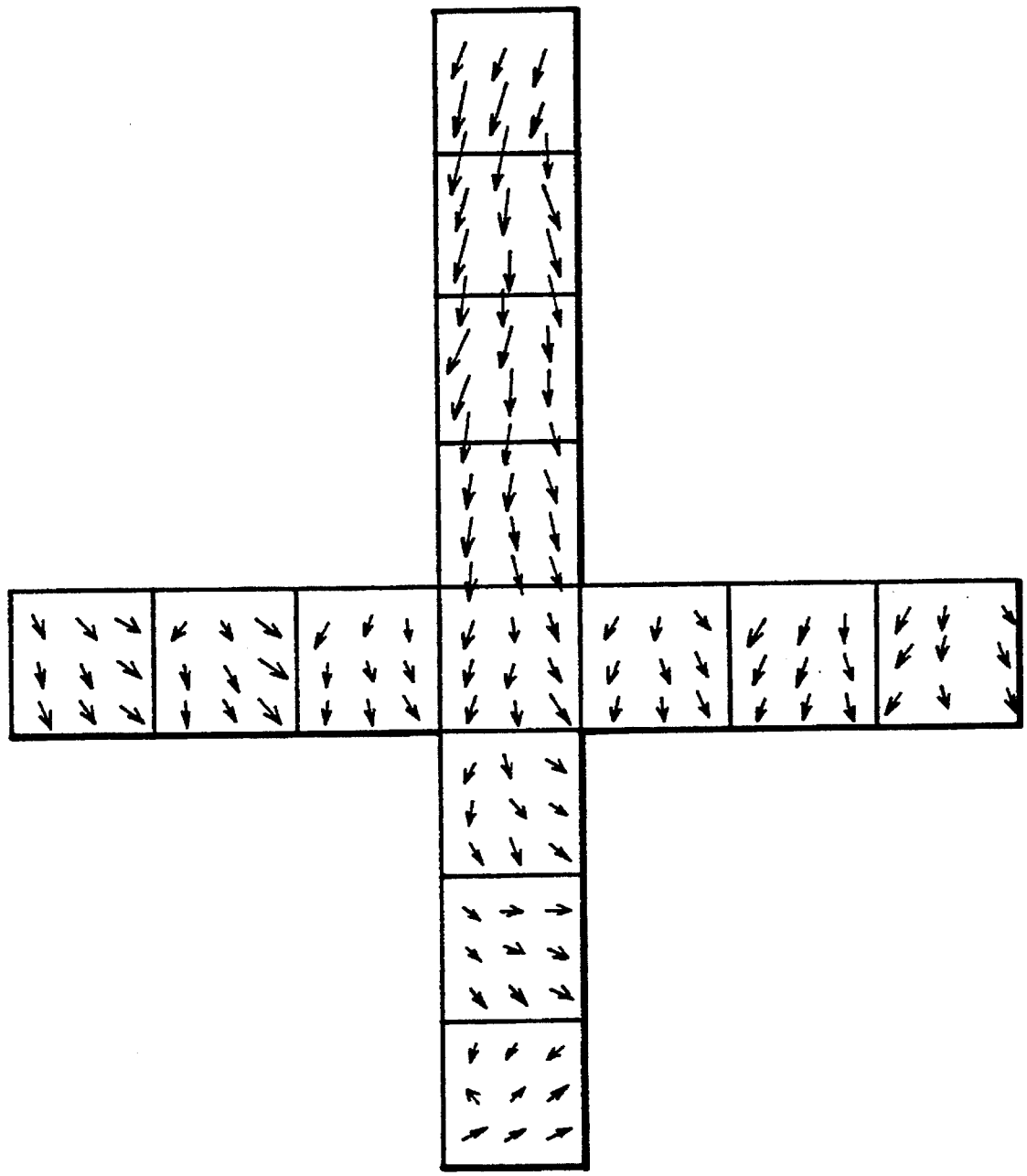
FIG. 8 is a diagram showing overlay deviation amounts of the X direction and the Y direction in the first embodiment in a vector representation fashion.

FIG. 8 is a diagram showing overlay deviation amounts of the X direction and the Y direction in a vector representation fashion.

[Process—130]

After overlay deviation amounts in respective measurement marks had been calculated, in each of the first overlay measurement pattern 10 and the corresponding second overlay measurement pattern 20, an overlay deviation difference ($\Delta X_S - \Delta X_C$, $\Delta Y_S - \Delta Y_C$) is calculated by subtracting the center measurement mark overlay deviation amount ($\Delta X_C$ and $\Delta Y_C$) from the periphery measurement mark overlay deviation amount ($\Delta X_S$ and $\Delta Y_S$).

Figure 9:
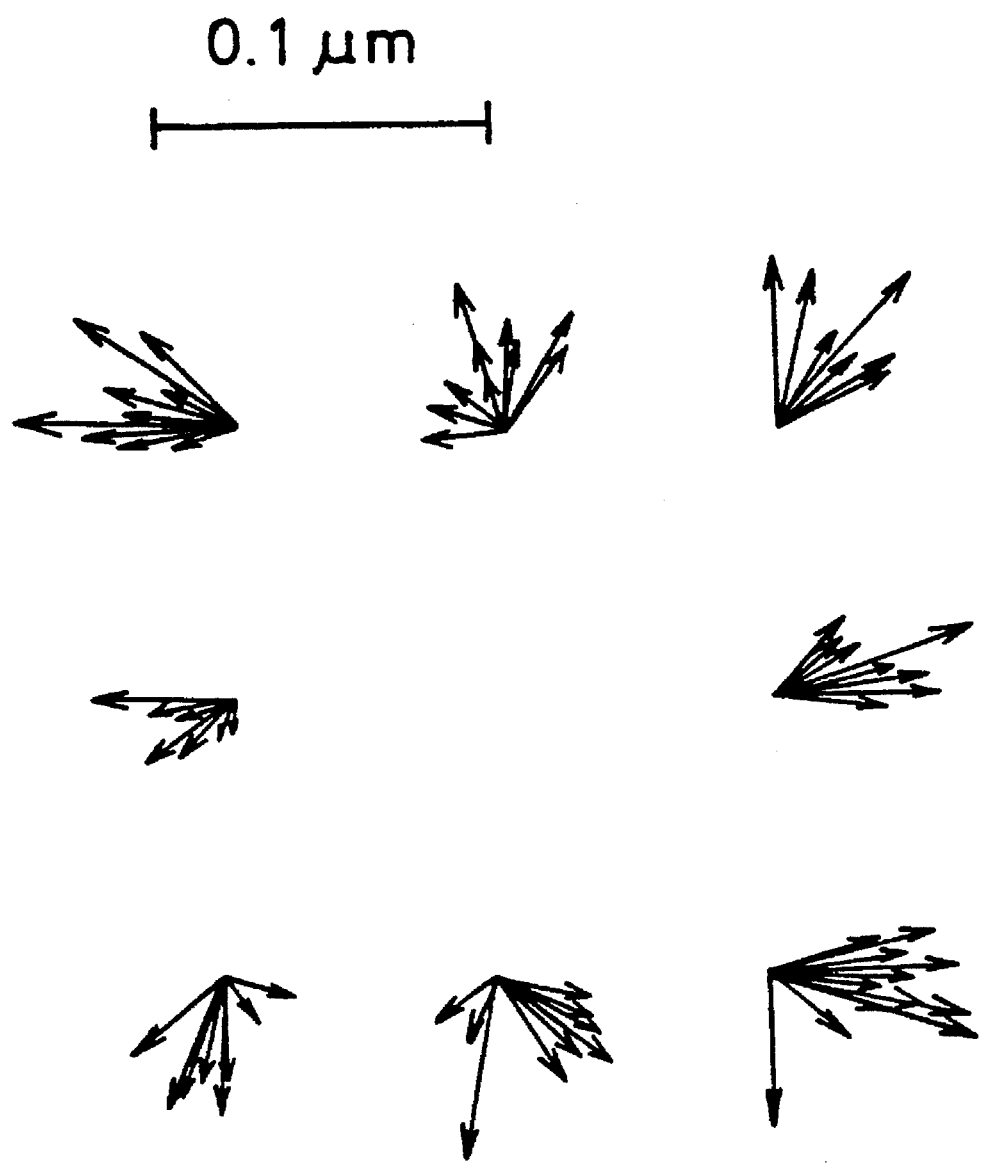
FIG. 9 is a diagram showing results that overlay deviation differences in the first embodiment are synthesized in a vector representation fashion.

FIG. 9 shows synthesized results of overlay deviation differences ($\Delta X_S - \Delta X_C$, $\Delta Y_S - \Delta Y_C$) of the X direction and the Y direction in a vector representation fashion and overlay deviation amount differences obtained in respective periphery measurement marks in the 14 overlay measurement patterns altogether.

As causes that the overlay deviation amount does not become zero in a certain first overlay measurement pattern 10 and the corresponding second overlay measurement pattern 20, there are enumerated the following ones:

(X) A lens distortion difference occurs between the stepper used to form the first overlay measurement pattern 10 and the stepper used to form the second overlay measurement pattern 20;

(Y) A semiconductor substrate is contracted by heat; and (Z) Under the condition that the semiconductor substrate is rotated, a pattern is transferred (so-called chip rotation occurs).

Further, an apparent overlay deviation among device elements is caused by the overlay metrology system. In the optical system, the apparent overlay deviation occurs when the following factors are not optimized sufficiently:

(a) A focus position of the overlay metrology system;

(b) An Image read-out system used when the measurement mark is read out and supplied to the overlay metrology system as an image (e.g., bright field image, dark field image, interference image, scattering image);

(c) Various constants of optical system, such as numerical aperture of lens, wavelength band of an illumination light or the like;

(d) Difference of intensity; and (e) Perpendicularity distortion of an optical axis of an illumination light.

In one first overlay measurement pattern 10 and the corresponding second overlay measurement pattern 20, it is considered that the influences of (X) to (Z) are substantially constant. Accordingly, if a fluctuation of the overlay deviation amount difference ($\Delta Xs-\Delta Xc$, $\Delta Ys-\Delta Yc$) is calculated, then the influences (X) to (Z) are canceled each other out. Consequently, the fluctuation of the overlay deviation amount difference ($\Delta Xs-\Delta Xc$, $\Delta Ys-\Delta Yc$) corresponds to the overlay measurement error contained in the overlay metrology system.

[Process—140]

Subsequently, measurement conditions of the overlay metrology system mentioned in (a) to (e) are adjusted such that fluctuations ($3\sigma_{X_a}$, $3\sigma_{Y_a}$) of the overlay deviation amount differences are minimized. The fluctuations ($3\sigma_{X_a}$, $3\sigma_{Y_a}$) of the overlay deviation amount differences can be obtained by calculating the fluctuations ($3\sigma_{X_a}$, $3\sigma$Ya) of the overlay deviation amount differences of the X direction and the Y direction in each of the periphery measurement marks (8 marks and 14 data/one place in the first embodiment) and average values ($3\sigma_{X_a}$, $3\sigma_{Y_a}$) of the fluctuations ($3\sigma_x$, $3\sigma Y$) of eight overlay deviation amount differences in these X and Y directions.

To be more concrete, tests of RUN-1 to RUN-4 in which focus position of the overlay metrology system, the image read-out system, the numerical aperture (NA) of the lens and the intensity were changed were carried out on the basis of [process—100] to [process—140]. Measured test results are indicated on the following table.

| FLUCTUATION OF OVERLAY DEVIATION AMOUNT DIFFERENCES (μm) | | |
| --- | --- | --- |
|  | $3\sigma_{Xa}$ | $3\sigma_{Ya}$ |
| RUN-1 | 0.057 | 0.060 |
| RUN-2 | 0.085 | 0.078 |
| RUN-3 | 0.020 | 0.022 |
| RUN-4 | 0.063 | 0.065 |

From the aforesaid measured results, it is to be understood that RUN-3 indicates the fluctuation of the minimized overlay deviation amount difference. Therefore, if the overlay accuracy is measured on the basis of the measurement conditions of the overlay metrology system such as the focus position, the image read-out system, the numerical aperture (NA) of the lens and the intensity of the overlay metrology system according to the combination of RUN-3, then a measurement error inherent in the overlay metrology system can be minimized.

A second embodiment is related to a second mode of the method of optimizing measurement condition of the overlay metrology system. According to the method of the second embodiment, overlay measurement patterns are formed on the substrate and overlay deviation amounts of measurement marks formed on these overlay measurement pattern areas are measured by the overlay metrology system. Then, measurement conditions of the overlay metrology system can be optimized on the basis of measured results of the overlay deviation amounts.

[Process—200]

In the method of the second embodiment of the present invention, an overlay measurement pattern having a plurality of measurement marks is formed on a substrate.

Figure 10:
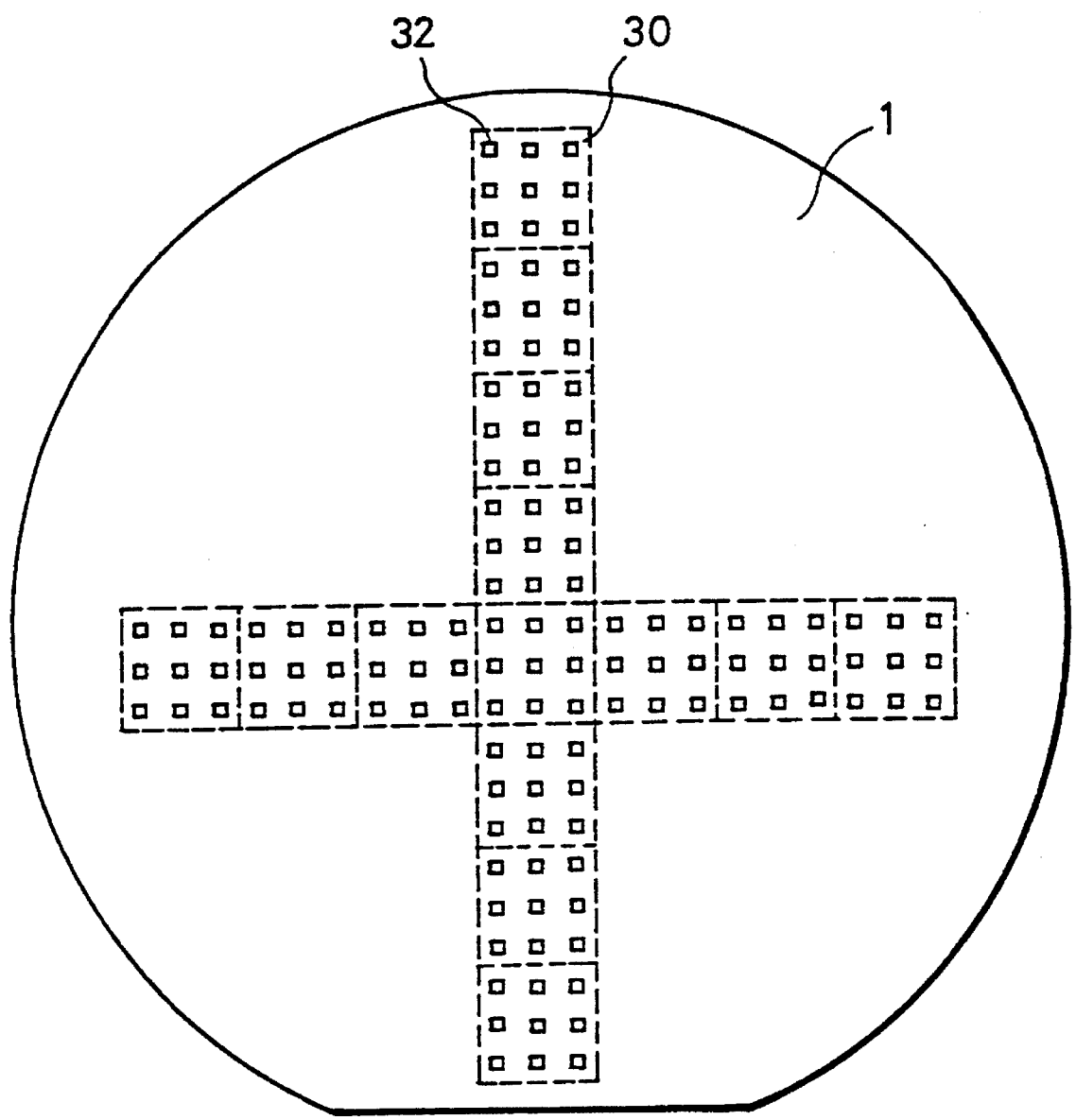
FIG. 10 is a plan view showing an overlay measurement pattern area formed on the substrate according to a second embodiment of the present invention.
Figure 11A:
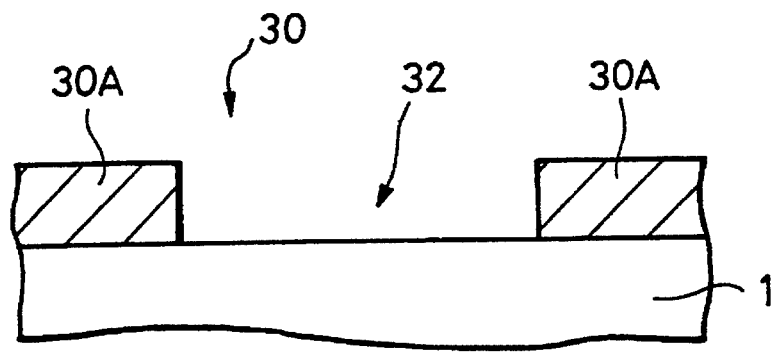
FIGS. 11A and 11B are a fragmentary cross-sectional view and a fragmentary plan view showing a first measurement mark formed on the overlay measurement pattern area according to the second embodiment of the present invention in an enlarged scale, respectively.
Figure 11B:
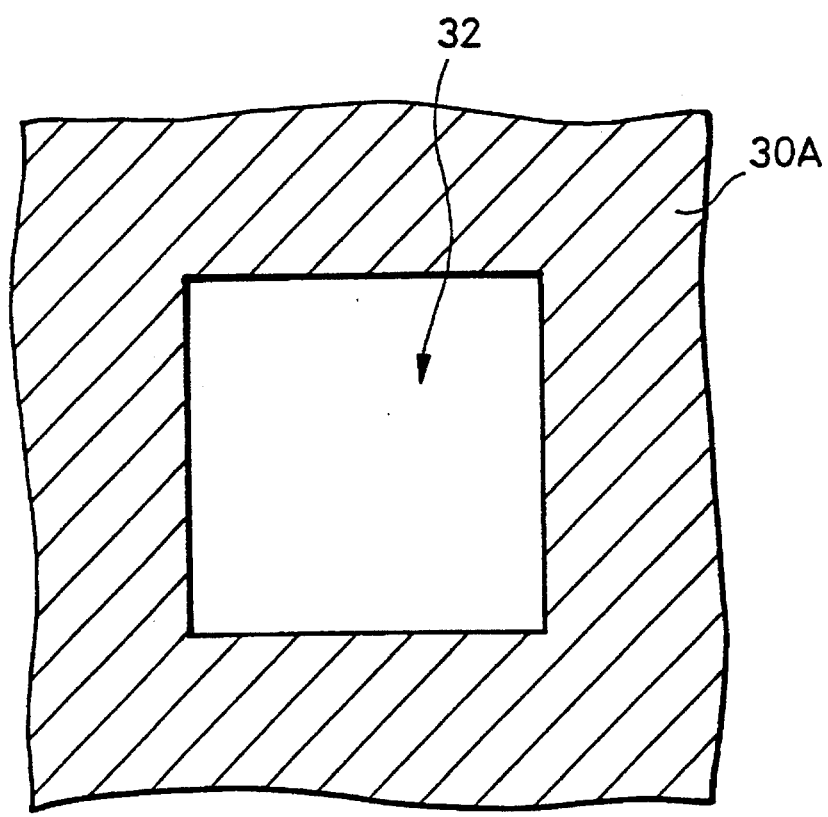

As shown in a schematic plan view of FIG. 10, a layer 30A made of $SiO_2$, for example, is formed on a substrate 1 by a CVD method, for example, and an overlay measurement pattern area 30 is formed on the layer 30A by the photolithography method. In the second embodiment, 14 overlay measurement pattern areas 30 are formed on the layer 30A. Dashed lines in FIG. 10 represent area occupied by the overlay measurement pattern areas 30. A plurality of first measurement marks 32 are formed in each of the overlay measurement pattern areas 30. In the second embodiment, the first measurement mark 32 is formed of an opening portion and nine first measurement marks 32 are formed on one overlay measurement pattern area 30. FIG. 11A is a fragmentary cross-sectional view and FIG. 11B a fragmentary plan view showing one first measurement mark 32 formed on the overlay measurement pattern area 30 in an enlarged scale. The first measurement mark 32 is shaped arbitrarily and is square whose one side is 20 μm in the second embodiment. The outer shape of the first measurement mark 32 is arbitrary, and is square in the second embodiment of the present invention, though not shown. Further, a distance between the first measurement marks 32 in the side direction of the square is selected to be 2.5 mm.

[Process—210]

Figure 12A:
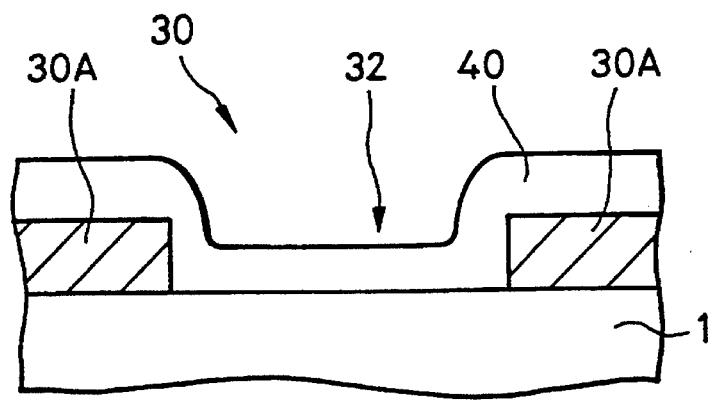
FIGS. 12A, 12B and 12C are respectively cross-sectional views showing a thin film layer formed on the overlay measurement pattern according to the second embodiment of the present invention, and a second measurement mark and a third measurement mark formed on the thin film in an enlarged scale.

Subsequently, a thin film layer 40 is formed on the overlay measurement pattern area 30 (see FIG. 12A). The thin film layer 40 may be an aluminum layer formed by a sputtering method, for example. The thin film layer 40 has a shape that is influenced by the first measurement mark 32 of the overlay measurement pattern area 30. To be more concrete, the thin film layer 40 has a shape influenced by the edge portion of the opening portion.

[Process—220]

Figure 12B:
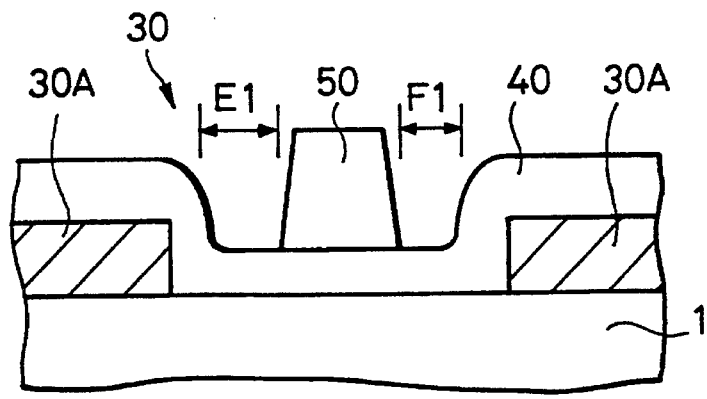

Then, on the thin film layer 40 formed above the respective first measurement marks 32 is formed a second measurement mark 50 made of a resist material (see FIG. 12B). The second measurement mark 50 can be formed by a conventional photolithography method.

The second measurement mark 50 is formed at substantially a central portion of the first measurement mark 32. The shape of the second measurement mark 50 is arbitrary and, in the second embodiment, the second measurement mark 50 is square whose one side is 10 μm.

A relative position relationship between a plurality of first measurement marks 32 and a relative position relationship between a plurality of second measurement marks 50 are made equal to each other from a design standpoint.

[Process—230]

Subsequently, changing various measurement conditions of the overlay metrology system, the overlay deviation amount between the shape of the thin film layer 40 affected by the shape of the first measurement mark 32 of the overlay measurement pattern 30 and the second measurement mark 50 is measured by the overlay metrology system thereby to obtain a first overlay deviation amount corresponding to various measurement conditions of the overlay metrology system.

That is to say, an overlay deviation amount between a stepped portion of the thin film layer 40 affected by the stepped portion of the first measurement mark 32 and the edge portion of the second measurement mark 50 is measured.

A measuring method using the overlay metrology system can be made similar to the method of the first embodiment. Further, various measurement conditions of the overlay metrology system depict various conditions of the above-mentioned (a) to (e). The overlay metrology system is set to the conditions made by variously combining the aforesaid conditions (a) to (e) and the first overlay deviation amount is measured. As the measurement conditions of the overlay metrology system, there can be enumerated the focus position, the image read-out system, the numerical aperture (NA) of the lens and the intensity of the overlay metrology system, by way of example.

The first overlay deviation amount can be calculated from $\Delta X_1 = (E_1 - F_1)/2$ on the basis of the values $E_1$ and $F_1$ shown in FIG. 12B. A first overlay deviation amount of $\Delta Y_1 = (G_1 - H_1)/2$ perpendicular to the sheet of drawing of FIG. 12B can be calculated similarly.

Particularly, in the measurement of the overlay deviation amount between the stepped portion of the thin film layer 50 before being etched and the edge portion of the second measurement mark 50, an error tends to occur because images obtained by the overlay metrology system are not clear generally. Accordingly, the overlay measurement error inherent in the overlay metrology system is increased.

[Process—240]

Figure 12C:
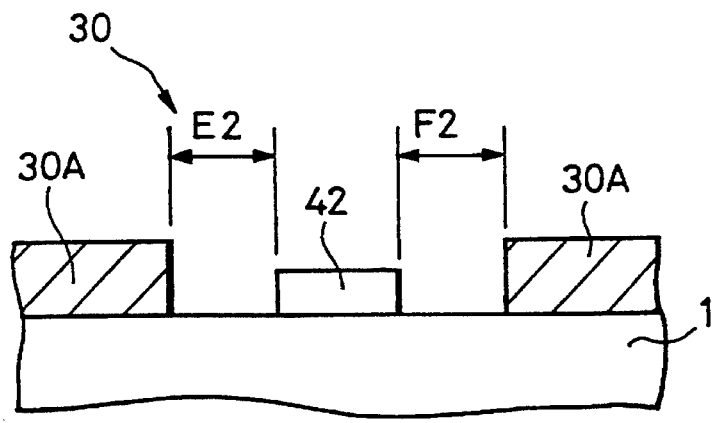

Subsequently, the thin film layer 40 is etched by using the second measurement mark 50 as a mask to form a third measurement mark 42 from the thin film layer 40 (see FIG. 12C). The etching may be carried out by a conventional reactive ion etching (RIE) method.

[Process—250]

Then, a second overlay deviation amount between the third measurement mark 42 and the first measurement mark 32 is measured by the overlay metrology system.

In this measurement, the third measurement mark 42 and the first measurement mark 32 are obtained by the overlay metrology system as very sharp images. Therefore, the overlay metrology system has a small overlay measurement error relative to the second overlay deviation amount between the third measurement mark 42 and the first measurement mark 32.

The measuring method by the overlay metrology system can be made similar to the method of the first embodiment. The second overlay deviation amount can be obtained from $\Delta X_2 = (E_2 - F_2)/2$ on the basis of the values of $E_2$ and $F_2$ shown in FIG. 12C. The first overlay deviation amount $\Delta Y_2 = (G_2 - H_2)/2$ in the direction perpendicular to the sheet of drawing of FIG. 12C also can be obtained similarly.

[Process—260]

Subsequently, fluctuations of overlay deviation amount differences that result from subtracting the second overlay deviation amounts ($\Delta X_2$, $\Delta Y_2$) from each of the first overlay deviation amounts ($\Delta X_1$, $\Delta Y_1$) are calculated. Then, measurement conditions of the overlay metrology system are selected such that the fluctuations of the overlay deviation amount differences are minimized.

More specifically, overlay deviation amount differences $\Delta X$ and $\Delta Y$ are calculated from the first overlay deviation amounts $(E_1-F_1)/2$ and $(G_1-H_1)/2$ corresponding to various measurement conditions of the overlay metrology system and the corresponding second deviation amounts $(E_2-F_2)/2$ and $(G_2-H_2)/2$ for each measurement mark of the overlay measurement pattern area 30 as:

$$\Delta X = (E_1-F_1)/2 - (E_2-F_2)/2$$

$$\Delta Y = (G_1-H_1)/2 - (G_2-H_2)/2$$

Figure 13:
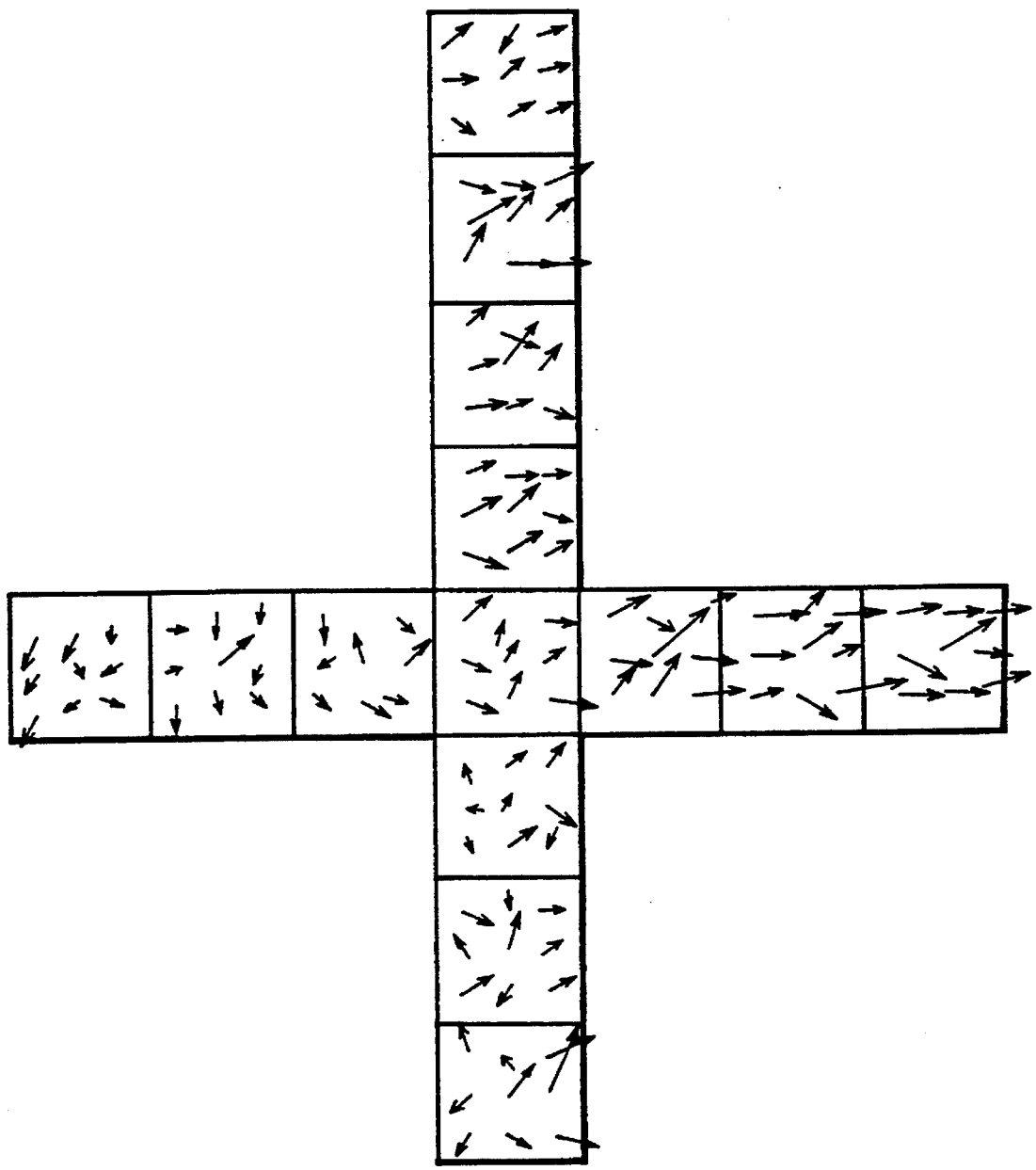
FIG. 13 is a diagram showing overlay difference amounts ΔX and ΔY in the second embodiment of the present invention in a vector representation fashion.

In the second embodiment, nine data are produced for each overlay measurement pattern area 30. FIG. 13 shows the overlay deviation amount differences $\alpha X$ and $\Delta Y$ in a vector representation fashion. Then, fluctuations ($3\sigma_X$, $3\sigma_Y$) within the overlay measurement pattern area are calculated. In the second embodiment, since 14 overlay measurement pattern areas 30 are provided on the substrate 1, average values ($3\sigma_{Xa}$, $3\sigma_{Ya}$) are calculated from fourteen data ($3\sigma_X$, $3\sigma_Y$).

A difference between the overlay deviation amounts before and after the etching, i.e., difference between the first and second overlay deviation amounts is caused by the measurement error inherent in the overlay metrology system. This measurement error is caused by the aforementioned conditions (a) to (e). Further, this measurement error also is caused by asymmetry of the shape of the thin film layer 40 affected by the first measurement mark 32 of the overlay measurement pattern area 30. Moreover, this measurement error is caused by an incident angle of ion in the etching process and asymmetry of the side walls of the second measurement mark.

However, the difference between the first and second overlay deviation amounts caused by these factors except the measurement error inherent in the overlay metrology system is substantially constant within one overlay measurement pattern area 30. To be more concrete, in the fluctuation of the overlay deviation difference that results from subtracting the first overlay deviation amount and the corresponding second overlay deviation amount from each other, these factors except the measurement errors inherent in the overlay metrology system can be canceled each other out. Also, the measurement error of the overlay metrology system relative to the second overlay deviation amount between the third measurement mark 42 and the first measurement mark 32 is small.

Accordingly, the overlay deviation amount difference that results from subtracting the corresponding second overlay deviation amount from the first overlay deviation amount is mainly caused by the measurement error inherent in the overlay metrology system when the first overlay deviation amount is measured. Therefore, the measurement conditions of the overlay metrology system provided such that the fluctuations ($3\sigma_{Xa}$, $3\sigma_{Ya}$) which result from subtracting the corresponding second overlay deviation amount from the respective first overlay deviation amounts corresponding to various measurement conditions of the overlay metrology system are minimized become the optimum measurement conditions.

More specifically, in the [process—230], tests of RUN-5 to RUN-8 in which the focus position of the overlay metrology system, the image read-out system, the numerical aperture (NA) of lens and the intensity are varied were carried out on the basis of the [process—200] to the [process—260]. Measured test results are illustrated on the table below.

| | FLUCTUATION OF OVERLAY DEVIATION AMOUNT DIFFERENCES (µm) | |
|---|---|---|
| | $3\sigma_{Xa}$ | $3\sigma_{Ya}$ |
| RUN-5 | 0.055 | 0.050 |
| RUN-6 | 0.080 | 0.070 |
| RUN-7 | 0.025 | 0.020 |
| RUN-8 | 0.059 | 0.053 |

From the above-mentioned measured test results, it is to be understood that RUN-7 indicates a minimum fluctuation of the overlay deviation amount difference. Accordingly, if the overlay accuracy before the etching process is measured on the basis of the measurement conditions of the overlay metrology system, such as the focus position, the image read-out system, the numerical aperture (NA) of the lens and the intensity of the overlay metrology system according to the combination on the RUN-7, then the measurement error inherent in the overlay metrology system can be minimized most.

A third embodiment is related to a third mode of a method of optimizing the measurement conditions of the overlay metrology system according to the present invention. According to the method of the third embodiment of the present invention, overlay deviation measurement pattern areas are formed on the substrate and the overlay deviation amounts of the measurement marks formed on these overlay measurement pattern areas are measured by the overlay metrology system. Then, the measurement conditions of the overlay metrology system are optimized on the basis of measured results of the overlay deviation amounts.

[Process—300]

According to the method of the third embodiment, a plurality of overlay measurement pattern areas having a plurality of first measurement marks and second measurement marks adjacent to the first measurement marks are formed on the substrate.

Figure 14:
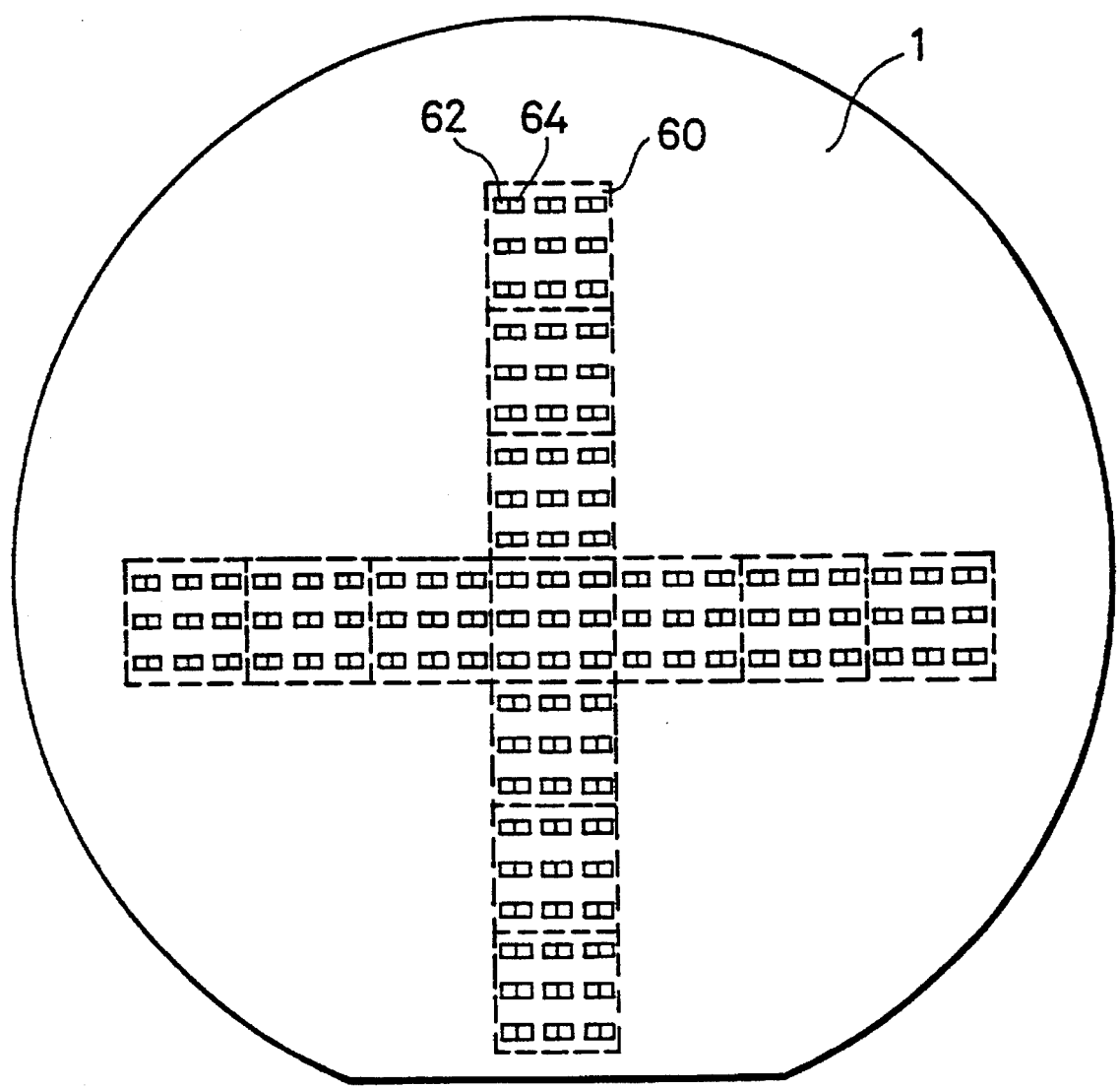
FIG. 14 is a plan view showing a first overlay measurement pattern formed on the substrate according to a third embodiment of the present invention.

As shown in a schematic plan view of FIG. 14, a layer 60A made of $SiO_2$, for example, is formed on the substrate 1 by a CVD method, for example, and a measurement pattern area 60 is formed on the layer 60A by a photolithography method. In the third embodiment, 13 overlay measurement pattern areas 60 are formed on the substrate 1. Dashed lines in FIG. 14 represent areas occupied by the overlay measurement pattern areas 60. Each of the overlay measurement pattern areas 60 includes a plurality of first measurement marks 62 and second measurement marks 64 adjacent to the respective first measurement marks 62. The first and second measurement marks 62 and 64 need not always be made adjacent to each other and the second measurement mark 64 may be disposed near the first measurement mark 62.

Figure 15A:
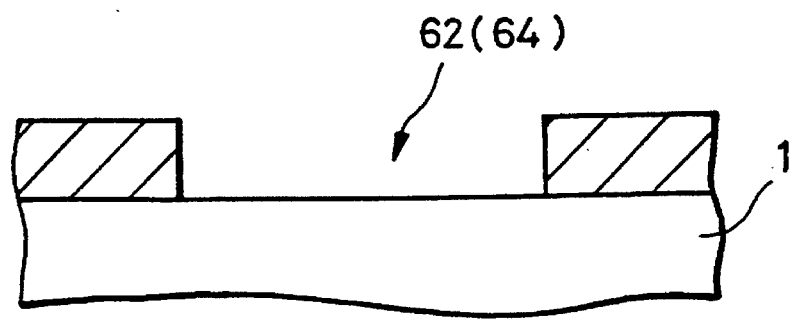
FIGS. 15A and 15B are a fragmentary cross-sectional view and a fragmentary plan view showing the overlay measurement pattern formed on the substrate according to the third embodiment of the present invention in an enlarged scale, respectively.
Figure 15B:
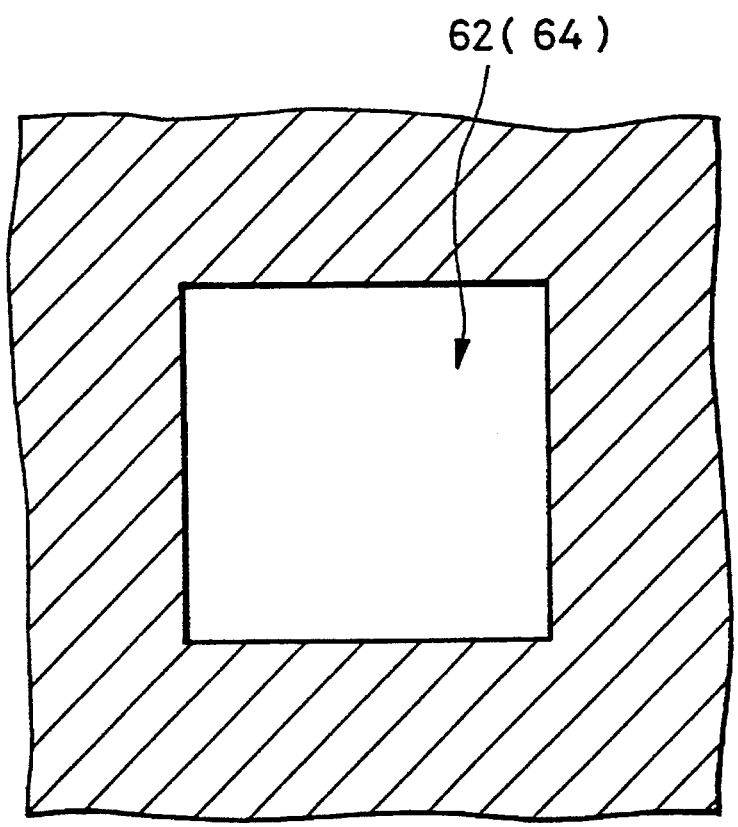

In the third embodiment of the present invention, the first and second measurement marks 62, 64 are formed of opening portions, for example, and nine first and second measurement marks 62, 64 are formed on one overlay measurement pattern area 60. FIG. 15A is a fragmentary cross-sectional view and FIG. 15B is a fragmentary plan view showing the first and second measurement marks 62, 64 formed on the overlay measurement pattern area 60 in an enlarged scale. While the shapes of the first and second measurement marks 62 and 64 are arbitrary, in the third embodiment of the present invention, the first and second measurement marks 62, 64 are square whose one side is 20 μm. Further, the outer shapes of the first and second measurement marks 62, 64 are selected to be arbitrary and may be square in the third embodiment of the present invention, though not shown. Furthermore, a distance between the first measurement marks 62 in the side direction of the square is selected to be 2.5 mm.

[Process—310]

Figure 16A:
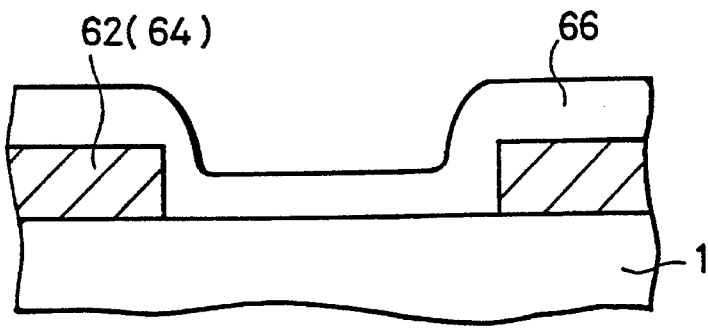
FIGS. 16A, 16B and 16C are cross-sectional views showing processes for forming the overlay measurement pattern according to the third embodiment of the present invention, respectively.

A thin film layer 66 is formed on the overlay measurement pattern 60 (see FIG. 16A). The thin film layer 66 can be formed as a thin film layer that can be etched and formed by the sputtering method, the CVD method, the oxidation method or the like. The thin film layer 66 has a shape that is affected by the first and second measurement marks 62, 64 of the overlay measurement pattern 60. To be more concrete, the thin film layer 66 has a shape that is influenced by the edge portion of the opening portion.

[Process—320]

Figure 16B:
Figure 16C:
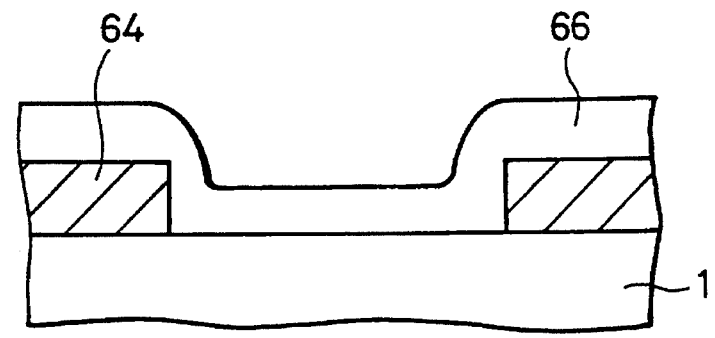

Subsequently, the thin film layer 66 formed above each of the first measurement marks 62 in each of the overlay measurement pattern area 60 is selectively removed. That is to say, the thin film layer 66 above each of the first measurement marks 62 is etched away by the photolithography technique and the etching technique. The etching may be carried out by the conventional reactive ion etching (RIE) method. In this case, the thin film layer 66 above the second measurement mark 64 is left (see FIGS. 16B and 16C).

[Process—330]

Subsequently, a third measurement mark 72 is formed relative to each of the first measurement mark 62 and a fourth measurement mark 74 is formed on the thin film layer 66 formed above each of the second measurement marks 64 (see FIGS. 17A and 17C). A relative position relationship of each of the third measurement marks 72 relative to each of the first measurement marks 62 is made equal to each other from a design standpoint. Further, a relative position relationship between each of the fourth measurement marks 74 relative to each of the second measurement marks 64 is made equal to each other from a design standpoint. The third and fourth measurement marks 72, 74 are made of a resist material and can be formed by the conventional photolithography method.

The third and fourth measurement marks 72, 74 are formed at substantially central portions of the first and second measurement marks 62, 64. The shapes of the third and fourth measurement marks 72, 74 are determined arbitrarily and square whose one side is 10 μm in the third embodiment.

[Process—340]

Thereafter, changing various measurement conditions of the overlay metrology system, the overlay deviation amount between the shape of the thin film layer 66 influenced by the shape of the second measurement mark 64 of the overlay measurement pattern area 60 and the fourth measurement mark 74 is measured by the overlay metrology system to thereby obtain the first overlay deviation amount corresponding to various kinds of measurement conditions of the overlay metrology system. In other words, the overlay deviation amount between the stepped portion of the thin film layer 66 formed with the influence of the stepped portion of the second measurement mark 64 and the edge portion of the fourth measurement mark 74 is measured.

Also, under the condition that the measuring conditions of the overlay metrology system are made constant, the overlay deviation amount between the first measurement mark 62 in the overlay measurement pattern area 60 and the third measurement mark 72 is measured by the overlay metrology system to thereby measure the second overlay deviation amount corresponding to the constant measurement condition of the overlay metrology system.

The measuring method of the overlay metrology system can be made similar to that of the first embodiment. Various measurement conditions of the overlay metrology system depict the aforesaid respective conditions (a) to (e). That is to say, the overlay metrology system is set to conditions made by variously combining the conditions (a) to (e) and the first overlay deviation amount is measured. As the measurement condition of the overlay metrology system, there can be enumerated the focus position, the image read-out system, the numerical aperture (NA) of the lens and the intensity of the overlay metrology system.

Figure 17A:
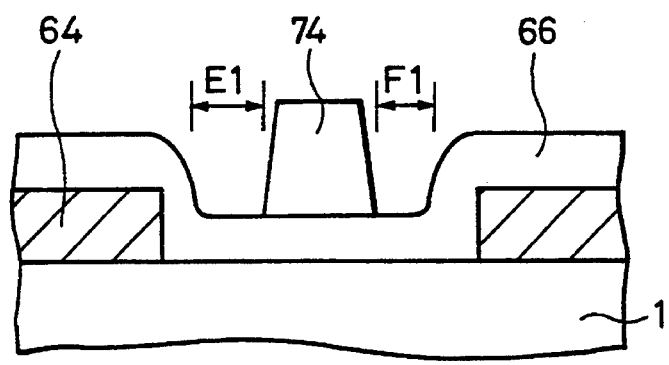
FIGS. 17A and 17B are cross-sectional views showing processes following the processes shown in FIGS. 16A, 16B and 16C for forming the overlay measurement pattern according to the third embodiment of the present invention, respectively.

The first overlay deviation amount can be calculated from $\Delta X_1 = (E_1 - F_1)/2$ on the basis of the values of $E_1$ and $F_1$ shown in FIG. 17A. The first overlay deviation amount $\Delta Y_1 = (G_1 - H_1)/2$ in the direction perpendicular to the sheet of drawing of FIG. 17A can be obtained similarly.

In the measurement of the first overlay deviation amount ($\Delta X_1$, $\Delta Y_1$) between the stepped portion of the thin film layer 66 and the edge portion of the fourth measurement mark 74, a measurement error tends to occur because images obtained by the overlay metrology system are generally not clear. Accordingly, the overlay measurement error inherent in the overlay metrology system becomes large.

Under the condition that the constant condition of the overlay metrology system is used as a standard measurement condition of the overlay metrology system, the second overlay deviation amount is measured. In this measurement, the third measurement mark 72 and the first measurement mark 62 are obtained as very sharp images by the overlay metrology system. Accordingly, the overlay measurement error of the overlay metrology system relative to the second overlay deviation amount between the third measurement mark 72 and the first measurement mark 62 is small.

Figure 17B:
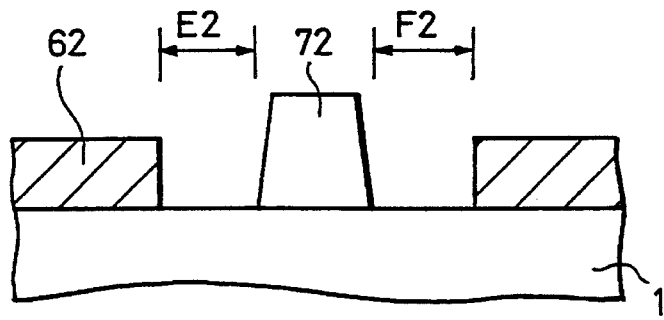

The second overlay deviation amount can be calculated from $\Delta X_2 = (E_2 - F_2/2)$ on the basis of the values $E_2$ and $F_2$ shown in FIG. 17B. The first overlay deviation amount $\Delta Y_2 = (G_2 - H_2)/2$ in the direction perpendicular to the sheet of drawing of FIG. 17B also can be obtained similarly.

[Process—350]

Subsequently, overlay deviation amount differences which result from subtracting the corresponding second overlay deviation amounts ($\Delta X_2$, $\Delta Y_2$) from the first deviation amounts ($\Delta X_1$, $\Delta Y_1$) corresponding to various measurement conditions of the overlay metrology system are calculated. Further, fluctuations of the overlay deviation amount differences are calculated. Then, the measurement conditions of the overlay metrology are selected such that the fluctuations of the overlay deviation amount differences are minimized.

More specifically, from the first overlay deviation amount $(E_1-F_1)/2$ and $(G_1-H_1)/2$ corresponding to various measurement conditions of the overlay metrology system and the second overlay deviation amounts $(E_2-F_2)/2$ and $(G_2-H_2)/2$, the overlay deviation amount differences $\Delta X$ and $\Delta Y$ are calculated for each of measurement marks of the overlay measurement pattern area 60 as:

$$\Delta X=(E_1-F_1)/2-(E_2-F_2)/2$$

$$\Delta Y=(G_1-H_1)/2-(G_2-H_2)/2$$

Figure 18:
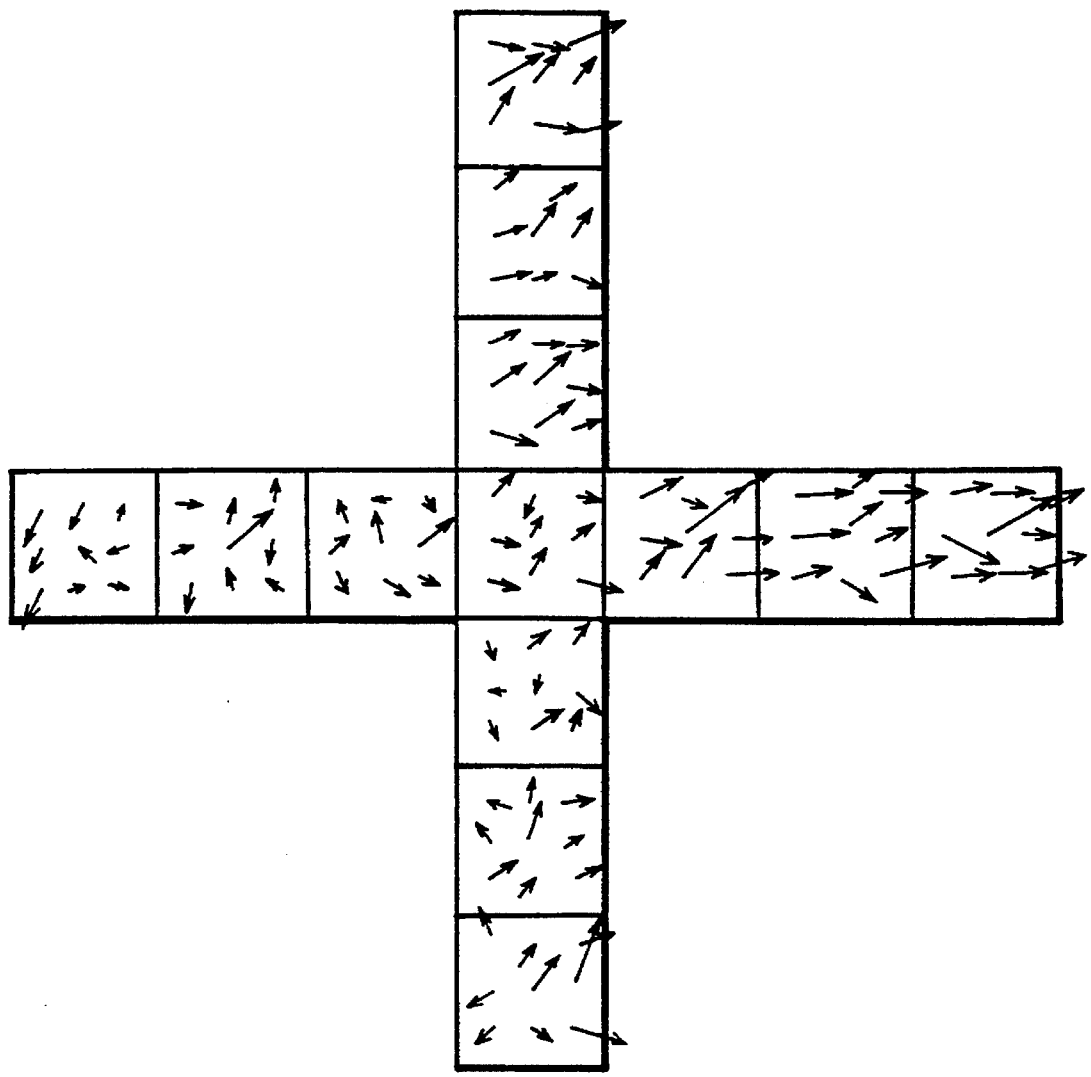
FIG. 18 is a diagram showing overlay deviation amounts of the X direction and the Y direction in the third embodiment of the present invention in a vector representation fashion.

In the third embodiment, there are nine data at every overlay deviation measurement pattern area 60. FIG. 18 shows the overlay deviation amount differences $\Delta X$ and $\Delta Y$ in a vector representation fashion. Then, fluctuations ($3\sigma_X$, $3\sigma_Y$) within the overlay measurement pattern area 60 are calculated. In the third embodiment, since 13 overlay measurement pattern areas 60 are provided on the substrate 1, the mean value ($3\sigma_{Xa}$, $3\sigma Ya$) is calculated from 13 data of ($3\sigma_X$, $3\sigma_Y$).

The overlay deviation amount differences are caused by the measurement error inherent in the overlay metrology system. The measurement error is caused by the aforesaid conditions (a) to (e). Further, the measurement error is caused by asymmetry of the shape of the thin film layer 66 that is influenced by the second measurement mark 64 of the overlay measurement pattern 60.

However, between the areas close to each other on the substrate, factors other than the measurement error inherent in the overlay metrology system contribute less to the overlay deviation amount differences. That is to say, although a very small difference exists between the second overlay deviation amount obtained from the overlay measurement pattern area 60 in which the thin film layer is selectively removed and the overlay deviation amount between the etched thin film layer obtained by etching the thin film layer 66 by using the fourth measurement mark 74 as an etching resist in the overlay measurement pattern area from which the thin film layer 66 is not removed and the second measurement mark, these two overlay deviation amounts have a satisfactory correlation therebetween.

Accordingly, fluctuations of overlay deviation amount differences which result from subtracting the corresponding second overlay deviation amount from each of the first overlay deviation amounts are mainly caused by the measurement error inherent in the overlay metrology system when the first overlay deviation amounts are measured. Therefore, the measurement conditions of the overlay metrology system in which the fluctuations ($3\sigma_{Xa}$, $3\sigma Ya$) of the overlay deviation amounts which result from subtracting the corresponding second overlay deviation amount from each of the first overlay deviation amounts are minimized become optimum measurement conditions.

To be more concrete, tests of RUN-9 to RUN-12 were carried out on the basis of [process—300] to [process—350] while the focus position, the image read-out system, the numerical aperture (NA) of the lens and the intensity of the overlay metrology system were changed in [process—340]. Measured test results are indicated on the table below.

| FLUCTUATION OF OVERLAY DEVIATION AMOUNT DIFFERENCES (μm) | | |
|---|---|---|
| | $3\sigma_{Xa}$ | $3\sigma_{Ya}$ |
| RUN-9 | 0.062 | 0.050 |
| RUN-10 | 0.070 | 0.078 |
| RUN-11 | 0.020 | 0.025 |
| RUN-12 | 0.060 | 0.063 |

From the above-mentioned results, it is to be understood that RUN-11 indicates the fluctuation of the minimum overlay deviation amount. Accordingly, if the overlay accuracy is measured under the measurement conditions of the overlay metrology system such as the focus position, the image read-out system, the numerical aperture (NA) of lens and intensity of the overlay metrology system according to the combination of the RUN-11, then the measurement error inherent in the overlay metrology system can be minimized.

A fourth embodiment is related to a method of optimizing an alignment mark shape or an alignment mark measurement system in the aligner. According to this method, a plurality of dies having a plurality of alignment marks are formed on a substrate, and position coordinates of alignment marks formed on the dies are measured by the alignment mark measurement system of the aligner. The method according to the fourth embodiment of the present invention will be described below.

[Process—400]

A plurality of dies 80 having a plurality of alignment marks 82 are formed on a substrate 1. In this case, each relative position relationship of alignment mark in each die is made equal from a design standpoint. Further, as the alignment mark, there are formed a positive alignment mark (see a fragmentary cross-sectional view of FIG. 19A) and a negative alignment mark (see fragmentary cross-sectional view of FIG. 19B) by the design dimensions (values of a and b in FIGS. 19A and 19B) where a+b=constant. Thus, it is possible to form alignment marks that are used to select optimum alignment mark shape. In the fourth embodiment, as shown in FIG. 19C, nine alignment marks 82 are formed within one die 80 and 14 dies 80 are formed within one substrate 1. The positions of the alignment marks are not limited to those illustrated in FIG. 19C.

Figure 20A:
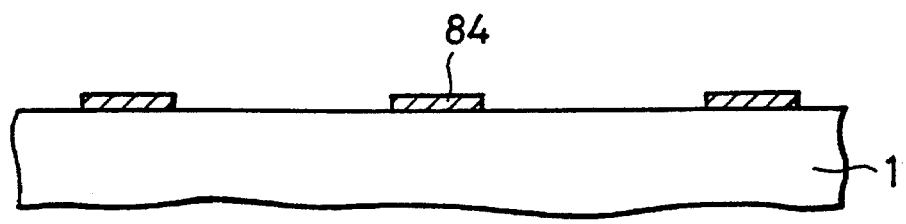
FIGS. 20A, 20B and 20C are schematic cross-sectional views used to explain a method of forming the alignment marks according to the fourth embodiment of the present invention.
Figure 20B:
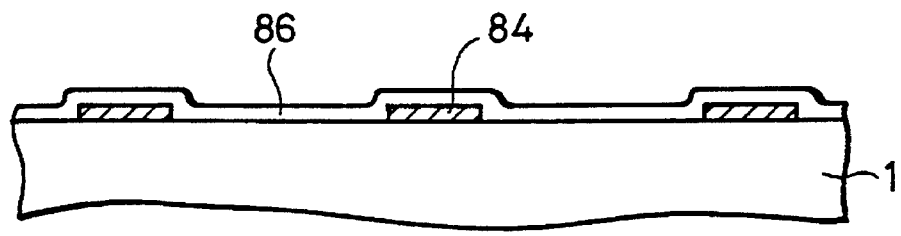
Figure 20C:
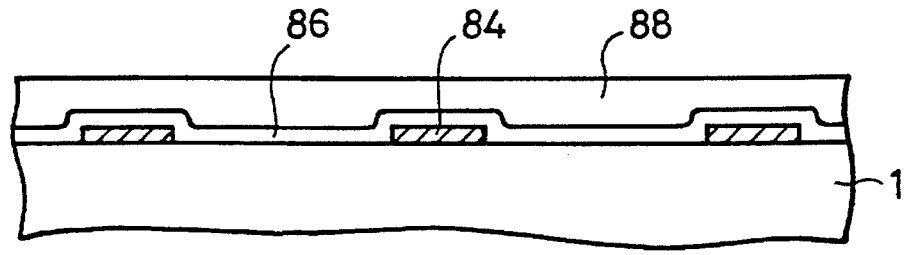

The alignment mark can be formed by the following method. A thin film layer 84 made of $SiO_2$ is formed on the substrate 1 by a sputtering method, a CVD method, an oxidation method or the like. The thin film layer 84 is treated by a photolithography technique and an etching technique as a pattern (see FIG. 20A). Thereafter, a thin film layer 86 made of, for example, tungsten is formed on the whole surface by a CVD method or the like (see FIG. 20B). The thin film layer 86 is a thin film layer corresponding to the etched layer in the actual manufacturing process of semiconductor apparatus. After the alignment mark 80 was formed as described above, a photosensitive resin layer 88 is formed on the surface of the substrate 1 (see FIG. 20C). In this way, there is formed the evaluation die having a plurality of (nine alignment marks in the fourth embodiment) alignment marks formed of the thin film layers 84, 86 and the photosensitive resin layer 88.

[Process—410]

A position coordinate ($X_m$, $Y_m$) is obtained by measuring positions of respective alignment marks according to various alignment mark measurement systems of the aligner.

An aligner of a certain type includes an alignment mark measurement system formed of three kinds of hardwares (LSA, FIA, LIA), for example. LSA is an abbreviation of "Laser Step Alignment" which is a diffraction grating system. FIA is an abbreviation of "Field Image Alignment" which is an image processing system utilizing a light with a continuous wavelength. LIA is an abbreviation of "Laser Interferometric alignment" which is a grating position detecting system using two-light flux heterodyne. For further details of the three kinds of hardwares, see "New Alignment Sensors For Optical Lithography", N. Magome, et al, Proc. of 1990 Intern. MicroProcess Conference, pp. 32–38 or the like.

The FIA includes a plurality of analytical algorithms, i.e., the alignment mark measuring system is comprised of a plurality of analytical algorithms. The analytical algorithm is referred to as a signal analyzing algorithm for analyzing a signal output from the hardware to recognize the edge portion such as an alignment mark or the like.

The analytical algorithm for recognizing the edge portion such as the alignment mark or the like utilizes "SINGLE" or "DOUBLE" as shown in FIG. 21B or 21C. When "SINGLE" is used (see FIG. 21B), a position corresponding to signal strength of 50% between the peak and the bottom is determined as the edge portion. When "DOUBLE" is used (see FIG. 21C), the position corresponding to signal strength of 50% between the peak and the bottom also is determined as the edge portion. In this case, there are provided three kinds of algorithms such as when the side (outside) of an open square is determined as the edge portion (OUT), the side (inside) of an open circle is determined as the edge portion or an average value of the outside and the inside is determined as the edge portion (BOTH). FIG. 21A is a fragmentary cross-sectional view schematically showing the substrate 1 on which alignment marks are formed.

An aligner of another type, for example, includes an alignment mark measurement system formed of two kinds of hardwares (HENE and BB) as an image processing system. The HENE is a system that utilizes an HeNe laser (single wavelength) as a light source for radiating an alignment mark with a laser beam when an image is read out. The BB is a system that utilizes a continuous wavelength (Broad Band).

[Process—420]

Subsequently, in each die 80, selected one of a plurality of alignment marks 82, e.g., alignment mark located at the center is used as a reference point and a relative position coordinate $(X_{m-r}, Y_{m-r})$ of each of other alignment marks relative to a position coordinate $(X_{m-0}, Y_{m-0})$ of such reference point is calculated from the position coordinate $(X_m, Y_m)$. That is, $$X_{m-r} = X_m - X_{m-0}$$

$$Y_{m-r} = Y_m - Y_{m-0}$$

are calculated for each of the alignment marks within the respective dies 80. When the alignment mark cannot be disposed at the center of the die 80, an average value of position coordinates of all alignment marks within the die 80 can be determined as the reference point.

[Process—430]

Then, a relative position coordinate $(X_{d-r}, Y_{d-r})$ of a position coordinate $(X_d, Y_d)$ of each of other alignment marks relative to a position coordinate $(X_{d-0}, Y_{d-0})$ of the reference point from a design standpoint is obtained by the calculation. That is to say, $$X_{d-r} = X_d - X_{d-0}$$

$$Y_{d-r} = Y_d - Y_{d-0}$$

are calculated for each of alignment marks within the respective dies 80. Thereafter, a relative position coordinate difference $(\Delta X, \Delta Y)$ is obtained by subtracting the relative position coordinate $(X_{d-r}, Y_{d-r})$ of each of the alignment marks thus obtained by the calculation from the relative position coordinate $(X_{m-r}, Y_{m-r})$ of each of alignment marks obtained from the measured position coordinate $(X_m, Y_m)$. That is, $$\Delta X = X_{m-r} - X_{d-r}$$

$$\Delta Y = Y_{m-r} - Y_{d-r}$$

are calculated for each of alignment marks within each die. FIG. 19 shows the relative position coordinate difference $(\Delta X, \Delta Y)$ in each die in a vector representation fashion.

Fluctuations $(3\sigma_X, 3\sigma_Y)$ of the relative position coordinate differences $(\Delta X, \Delta Y)$ (eight position coordinate differences in the fourth embodiment) within the die 80 are calculated. Further, in the fourth embodiment of the present invention, since 14 dies 80 are formed on the substrate 1, the average value $(3\sigma_{Xa}, 3\sigma_{Ya})$ is calculated from 14 data $(3\sigma_X, 3\sigma_Y)$.

More specifically, FIA and LIA were employed as the hardware, a positive alignment mark was used and the alignment mark whose one side has an undersize of 0.3 μm was used. That is to say, the alignment mark in which the value of $\{(a+b)/2-a\}$ in FIG. 19A is 0.3 μm was utilized. Average values $(3\sigma_{Xa}, 3\sigma_{Ya})$ thus obtained were indicated on the following table:

| | FLUCTUATION OF OVERLAY DEVIATION AMOUNT DIFFERENCES (μm) | | |
|---|---|---|---|
| | | $3\sigma_{Xa}$ | $3\sigma_{Ya}$ |
| RUN-13 | FIA/DOUBLE/IN | 0.105 | 0.112 |
| RUN-14 | FIA/DOUBLE/OUT | 0.059 | 0.052 |
| RUN-15 | FIA/DOUBLE/BOTH | 0.082 | 0.084 |
| RUN-16 | LIA | 0.085 | 0.079 |

From the above-mentioned measured results, it is to be understood that RUN-14 indicates the smallest fluctuation $(3\sigma_{Xa}, 3\sigma_{Ya})$. Therefore, it can be concluded that the hardware (FIA) and the analytical algorithm (DOUBLE/OUT) according to the combination of RUN-14 form the optimum alignment measurement system.

While preferred embodiments of the present invention had been described so far, the present invention is not limited to those embodiments. The shapes, dimensions, positions, arrays of the first center and periphery measurement marks and the second center and periphery measurement marks and the numbers of the overlay measurement patterns or dies and alignment marks are not limited to those of the embodiments and can be changed freely if necessary.

Further, the shapes and the numbers of the overlay measurement pattern areas, and the shapes, the dimensions, the positions, and the array of the first and second measurement marks and the alignment marks also can be changed freely if necessary. Furthermore, the measurement conditions of the overlay metrology system can be variously selected depending upon the overlay metrology system.

According to the present invention, in order to minimize the measurement error inherent in the overlay metrology system, measurement conditions of the overlay metrology system can be optimized without measuring the true overlay deviation amount. Since the measurement conditions of the overlay metrology system can be optimized before the etching process, the measurement conditions of the overlay metrology system can be optimized in a short period of time.

Further, according to the present invention, the measurement conditions of the overlay metrology system can be optimized such that the true overlay deviation amounts of the semiconductor device elements in the semiconductor device after the etching process and the overlay deviation amounts measured of the semiconductor device elements in the semiconductor device before the etching process are correlated.

Furthermore, the substrates and the number of processes required to optimize the alignment mark measurement system can be reduced. Besides, the alignment mark shape or the alignment mark measurement system can be optimized without etching process.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A method in which overlay deviation amounts between a plurality of first overlay measurement patterns and second overlay measurement patterns formed on a substrate are measured by an overlay metrology system and measurement conditions of said overlay metrology system are optimized on the basis of measured results of said overlay deviation amounts, comprising the steps of:

forming on a substrate a plurality of first overlay measurement patterns, each being formed of a first center measurement mark and a plurality of periphery measurement marks disposed at the periphery of said center measurement mark;

forming on a substrate a plurality of second overlay measurement patterns, each being formed of a second center measurement mark and a plurality of second periphery measurement marks disposed at the periphery of said second center measurement mark, a relative position relationship between said first center measurement mark and said first periphery measurement mark being equal to a relative position relationship between said second center measurement mark and said second periphery measurement mark from a design standpoint such that said second center measurement mark is formed at substantially a central portion of said first center measurement mark and that a plurality of second periphery measurement marks are formed at substantially central portions of a plurality of first periphery measurement marks;

measuring the center measurement mark overlay deviation amount between said first center measurement mark and said second center measurement mark by an overlay metrology system in each of said first overlay measurement pattern and a corresponding second overlay measurement pattern to measure a periphery measurement mark overlay deviation amount between said first periphery measurement mark and the corresponding second periphery measurement mark; and obtaining an overlay deviation amount difference by subtracting the center measurement mark overlay deviation amount from each of said periphery measurement mark overlay deviation amounts in each of said first overlay measurement pattern and the corresponding second overlay measurement pattern, wherein measurement conditions of said overlay metrology system are adjusted such that fluctuations of the overlay deviation amount differences are minimized.

2. A method of optimizing measurement conditions of an overlay metrology system according to claim 1, wherein said process for forming a plurality of first overlay measurement patterns on said substrate comprises the steps of forming a resist layer on a layer made of $SiO_2$, SiN, polysilicon, WSi, W or aluminum formed on a semiconductor substrate by a CVD method, an oxidation method or sputtering method and forming a plurality of first overlay measurement patterns on said layer by a lithography method and an etching method, and said process for forming a plurality of second overlay measurement patterns on said substrate comprises the steps of forming a resist layer on a semiconductor substrate in which a plurality of first overlay measurement patterns are formed and forming a plurality of second overlay measurement patterns on said resist layer by a lithography method.

3. A method in which an overlay measurement pattern area is formed on a substrate, an overlay deviation amount of a measurement mark formed on said overlay measurement pattern area is measured by an overlay metrology system and measurement conditions of said overlay metrology system are optimized on the basis of measured results of the overlay deviation amount, comprising the steps of:

forming an overlay measurement pattern area having a plurality of first measurement marks on a substrate;

forming a thin film layer on said overlay measurement pattern area;

forming a second measurement mark made of a resist material and whose relative position relationship is equal to a relative position relationship between a plurality of first measurement marks on said thin film layer above each of said first measurement marks;

measuring an overlay deviation amount between a shape of a thin film layer affected by a shape of said first measurement mark of said overlay measurement area and the second measurement mark corresponding to said first measurement mark by said overlay metrology system while changing various measurement conditions of said overlay metrology system to thereby obtain a first overlay deviation amount corresponding to various measurement conditions of said overlay metrology system;

etching said thin film layer by using said second measurement mark as a mask to form a third measurement mark from said thin film layer;

measuring a second overlay deviation amount between said third measurement mark and said first measurement mark corresponding to said third measurement mark by said overlay metrology system; and calculating an overlay deviation amount difference indicative of a difference between the first overlay deviation amount corresponding to various measurement conditions of said overlay metrology and the corresponding second overlay deviation amount, wherein measurement conditions of said overlay metrology system are selected such that a fluctuation of said overlay deviation amount difference is minimized.

4. A method in which an overlay measurement pattern area is formed on a substrate, an overlay deviation amount of a measurement mark formed on said overlay measurement pattern area is measured by an overlay metrology system and measurement conditions of said overlay metrology system are optimized on the basis of measured results of the overlay deviation amount, comprising the steps of:

forming on a substrate a plurality of overlay measurement pattern areas having a plurality of first measurement marks and second measurement marks adjacent to each of said first measurement marks;

forming a thin film layer on said overlay measurement pattern areas;

selectively removing the thin film layers on said first measurement marks to leave the thin film layer on the second measurement mark;

forming a third measurement mark whose relative position relationship is designed to be equal to each of said first measurement marks in accordance with each of said first measurement marks and a fourth measurement mark whose relative position relationship is designed to be equal to each of said second measurement marks on a thin film layer formed above each of said second measurement mark;

measuring an overlay deviation amount between a shape of a thin film layer formed with an influence of a shape of said second measurement mark in said overlay measurement pattern area and the fourth measurement mark by said overlay metrology system while changing various measurement conditions of said overlay metrology system to thereby obtain a first overlay deviation amount corresponding to various measurement conditions of said overlay metrology system and measuring an overlay deviation amount between said first measurement mark and said third measurement mark of said overlay measurement pattern area by said overlay metrology system while measurement conditions of said overlay metrology system are made constant to thereby obtain a second overlay deviation amount corresponding to a certain measurement condition of said overlay metrology system; and calculating an overlay deviation amount difference indicative of a difference between the first overlay deviation amount corresponding to various measurement conditions of said overlay metrology system and the corresponding second overlay deviation amount, wherein measuring conditions of said overlay metrology system are selected such that a fluctuation of said overlay deviation amount difference is minimized.

5. A method in which a plurality of dies having a plurality of alignment marks are formed on a substrate and position coordinates of alignment marks formed on said dies are measured by an alignment mark measurement system of an aligner to thereby optimize the alignment mark shape or the alignment mark measurement system of the aligner, comprising the steps of:

coating a substrate surface with a photosensitive resin after a plurality of dies having a plurality of alignment marks had been formed on a substrate by making relative position relationships designed to each of alignment marks in each die equal;

measuring positions of respective alignment marks by an alignment mark measurement system of said aligner to calculate a position coordinate $(X_m, Y_m)$;

calculating a relative position coordinate $(X_{m-r}, Y_{m-r})$ of each of other respective alignment marks relative to a position coordinate $(X_{m-0}, Y_{m-0})$ of a reference point, said reference point being one of a plurality of alignment marks in each die or said reference point being an average value of position coordinates of all alignment marks within said die from a position coordinate $(X_m, Y_m)$; and calculating a relative position coordinate $(X_{d-r}, Y_{d-r})$ designed for each of other alignment marks relative to a reference point to calculate a relative position coordinate difference $(\Delta X, \Delta Y)$ indicative of a difference between said position coordinate $(X_{d-r}, Y_{d-r})$ and a relative position coordinate $(X_{m-r}, Y_{m-r})$ of each alignment mark calculated in the preceding process, wherein an alignment mark or alignment mark measurement system is selected such that a fluctuation of a position coordinate difference $(\Delta X, \Delta Y)$ among a plurality of dies becomes minimum.

\* \* \* \* \*